(12) United States Patent
Lai et al.

(10) Patent No.: US 12,012,481 B2
(45) Date of Patent: Jun. 18, 2024

(54) BLOCK COPOLYMER INTRINSIC STRETCHABLE ELECTROLUMINESCENT ELASTOMER AND PREPARATION METHOD AND APPLICATION THEREOF

(71) Applicant: Nanjing University of Posts and Telecommunications, Nanjing (CN)

(72) Inventors: Wen-Yong Lai, Nanjing (CN); Wan Song, Nanjing (CN); Xiangchun Li, Nanjing (CN); Yu Yan, Nanjing (CN); Wei Huang, Nanjing (CN)

(73) Assignee: Nanjing University of Posts and Telecommunications, Nanjing (CN)

( * ) Notice: Subject to any disclaimer, the term of this patent is extended or adjusted under 35 U.S.C. 154(b) by 673 days.

(21) Appl. No.: 17/133,884

(22) Filed: Dec. 24, 2020

(65) Prior Publication Data
US 2021/0403638 A1    Dec. 30, 2021

(51) Int. Cl.
*C08G 61/02*    (2006.01)
*C09K 11/06*    (2006.01)

(52) U.S. Cl.
CPC ............... *C08G 61/02* (2013.01); *C09K 11/06* (2013.01); *C08G 2261/126* (2013.01); *C08G 2261/142* (2013.01); *C08G 2261/1434* (2013.01); *C08G 2261/147* (2013.01); *C08G 2261/3327* (2013.01); *C09K 2211/1416* (2013.01); *C09K 2211/1466* (2013.01); *C09K 2211/185* (2013.01)

(58) Field of Classification Search
CPC ............ C09K 11/06; C09K 2211/1416; C09K 2211/1466; C09K 2211/185; C08G 61/02; C08G 2261/142; C08G 2261/1439; C08G 2261/147; C08G 2261/3327
See application file for complete search history.

(56) References Cited

FOREIGN PATENT DOCUMENTS

CN    111635504    *   9/2020

\* cited by examiner

*Primary Examiner* — C Melissa Koslow

(57) ABSTRACT

The invention discloses a block copolymer intrinsic stretchable electroluminescent elastomer and its preparation method and application. This type of elastomer is made from organic electroluminescent monomers, styrene and 1,3-butadiene through anionic polymerization. The innovation of the present invention is: for the first time, the organic electroluminescence unit is introduced into the elastomer by chemical crosslinking. On the basis of improving the intrinsic stretchability of the elastomer, at the same time, it has characteristics of excellent luminescence and high carrier mobility, novel structure and unique design strategy; meanwhile, it also solves the inherent non-stretchability problem of traditional organic optoelectronic materials and the problem that traditional elastomers do not have electroluminescent properties. This type of elastomer is used as a light-emitting layer material to prepare organic electroluminescent devices with high stability, high stretchability and high efficiency.

5 Claims, 2 Drawing Sheets

BLOCK COPOLYMER INTRINSIC STRETCHABLE ELECTROLUMINESCENT ELASTOMER AND PREPARATION METHOD AND APPLICATION THEREOF

FIELD OF THE INVENTION

The invention belongs to the technical field of optoelectronic materials and applications, and it specifically relates to a block copolymer intrinsically stretchable electroluminescent elastomer and its preparation method and application.

BACKGROUND OF THE INVENTION

As an emerging frontier technology, stretchable electronics have broad application prospects in the fields of smart home, biomedicine, information energy, and wearable devices. The development of stretchable electronic technology will drive the overall upgrading of electronic circuits, semiconductor materials, device packaging and other industries, enhance the added value of the industry, and bring revolutionary changes to people's production and life. As an important carrier of stretchable electrons, stretchable optoelectronic devices have received extensive attention. Stretchable optoelectronic devices generally include electrode layers, optoelectronic functional layers and interface layers. The coordinated development of stretchability of each functional layer is a prerequisite for preparing optoelectronic devices with excellent stretchability and optoelectronic properties. At present, the research on stretchable optoelectronic devices mainly focuses on the electrode layer, while the research on the optoelectronic functional layer is seldom concerned. However, as the core component of the stretchable optoelectronic device, the optoelectronic functional layer's stretchability and optoelectronic properties often affect the overall performance of the stretchable optoelectronic device. Therefore, the design and development of elastomers with excellent performance is of great significance.

At present, traditional elastomers such as block copolymer elastomers, thermoplastic elastomers, and hydrogels containing hydrogen bonds or strong ionic bonds that have been reported show excellent tensile properties, but they do not have optical and electrical properties. Although photoluminescent elastomers have excellent tensile properties and light-emitting properties, they still do not have electroluminescent properties, which limits their application in the field of stretchable electronics. In addition, electronic functional materials such as conductive polymers, silver nanowires, luminescent materials, etc. can be physically blended with traditional elastomers to achieve electroluminescence performance and weak stretchability, but they do not have intrinsic stretchability. In addition, phase separation and changes in the morphology of the film are prone to occur during the stretching-release process, which reduces the stability and life of the device. It is not an ideal method for preparing stretchable optoelectronic devices. However, so far there has been no report on intrinsically stretchable electroluminescent elastomers. This patent invented a block copolymer intrinsically stretchable electroluminescent elastomer, which is used as an organic light-emitting layer material in organic electroluminescent devices. At present, the preparation of stretched electroluminescent materials is through physical blending, which is easy to cause phase separation, and the stretching effect is poor. The intrinsic stretchable electroluminescent elastomer material is a pure chemical structural material, without doping, which can effectively improve stretchability and photoelectric properties. The intrinsic stretchable electroluminescent elastomer material is a pure chemical structural material, without doping, it can effectively improve stretchability and photoelectric properties. From the aspects of molecular engineering, material structure, film morphology, and device preparation, the material properties are analyzed and tested from multiple angles to achieve the best balance between the intrinsic stretchability of the electroluminescent elastomer and the optoelectronic properties.

SUMMARY OF THE INVENTION

Technical Problem

The invention discloses a block copolymer intrinsically stretchable electroluminescent elastomer, a preparation method and its application as a light-emitting layer material in an organic electroluminescent device. The invention introduces the organic electroluminescence unit into the traditional elastomer by chemical crosslinking for the first time to prepare a new type of electroluminescence elastomer with excellent stretchability and photoelectric properties. It provides a new technical solution for how to realize the organic electroluminescence properties of traditional elastomers and how to solve the inherent inextensibility problem of traditional optoelectronic materials.

Technical Solutions

The present invention provides a block copolymer intrinsically stretchable electroluminescent elastomer, which has the following general structural formula:

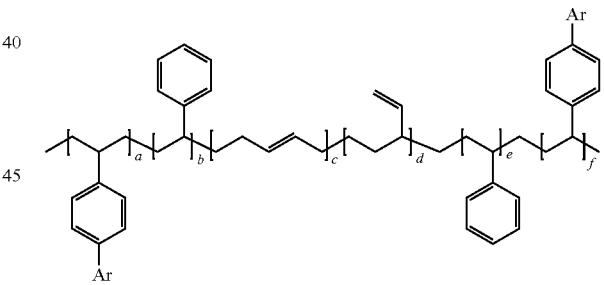

Among them, a, b, c, d, e, f represent the molar component of the block component, at least one of a and f is present, at least one of b and e is present, at least one of c and d is present, and $a+b+c+d+e+f=1$; Ar is selected from one of the following groups:

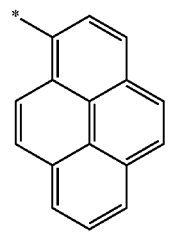

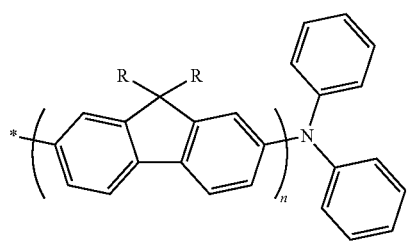
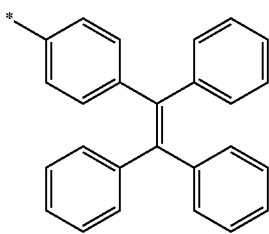
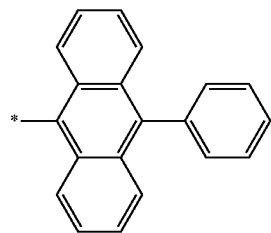
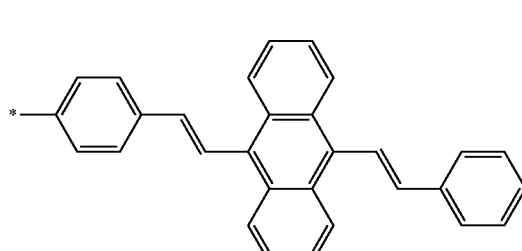
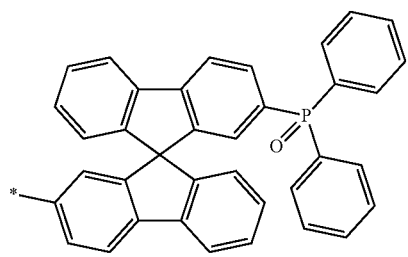
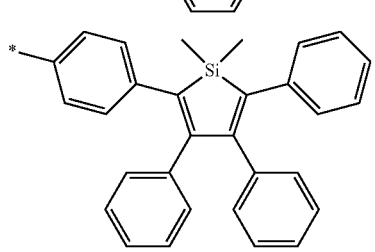
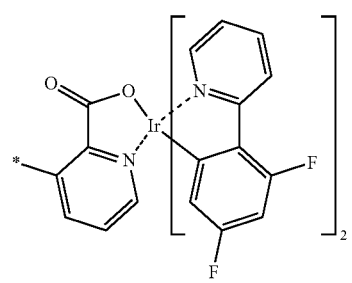
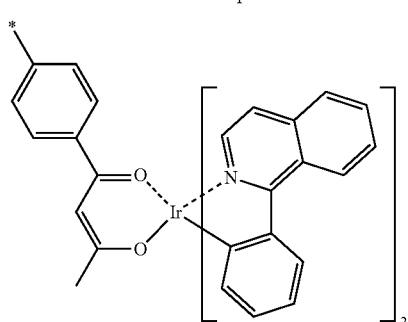
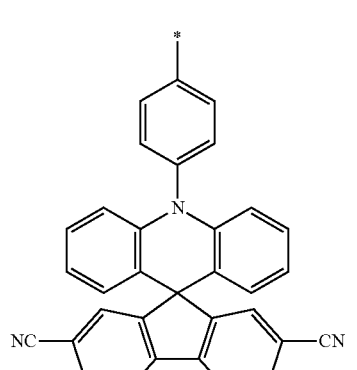
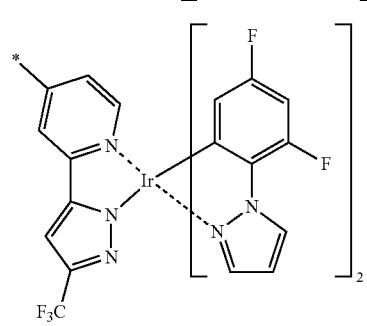
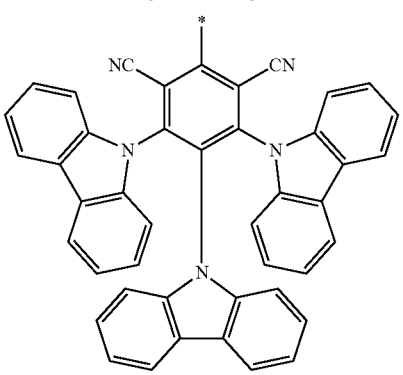

-continued
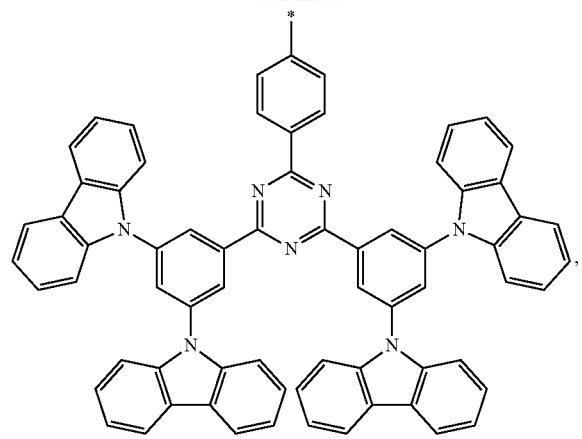
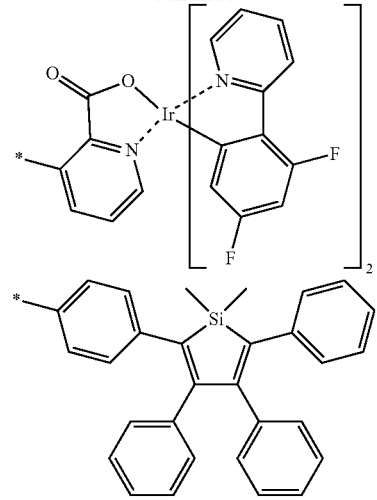
among them, R is a $C_1$-$C_{20}$ linear or branched alkyl group, the number of n is 1-6, and * is the connection position.
If Ar is
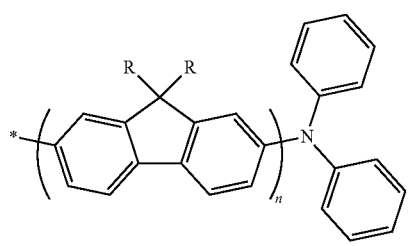
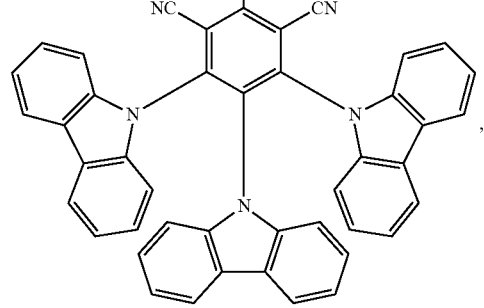
the specific structure corresponds to:
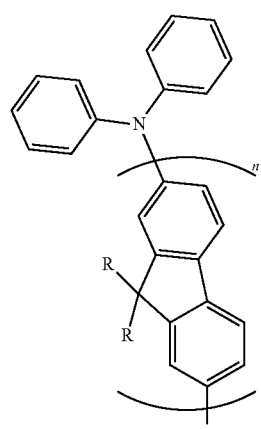

-continued
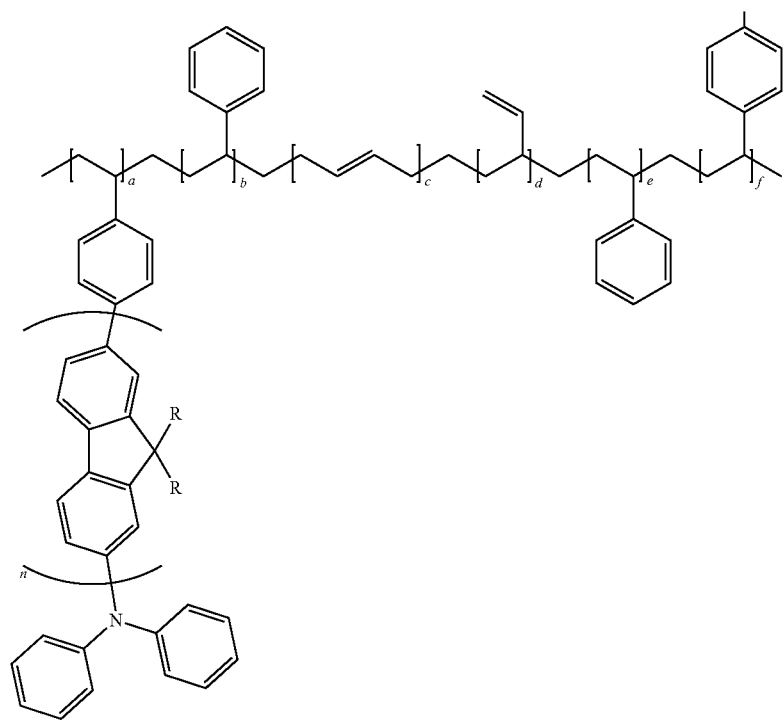
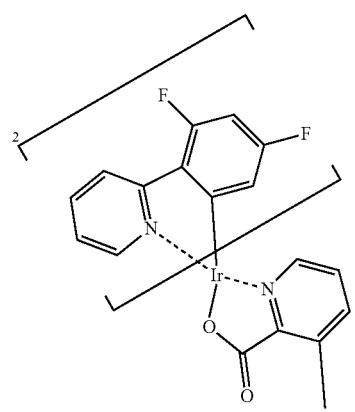

-continued
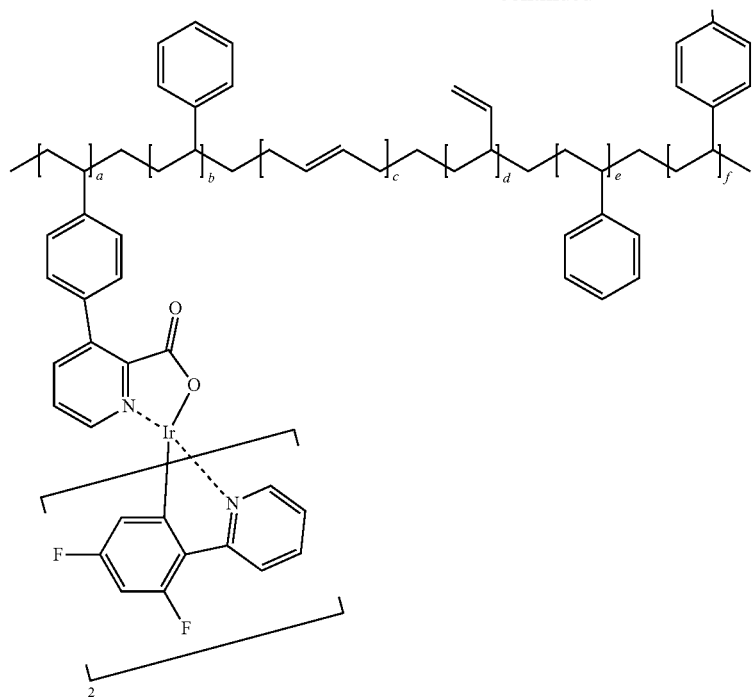
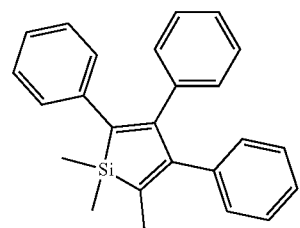
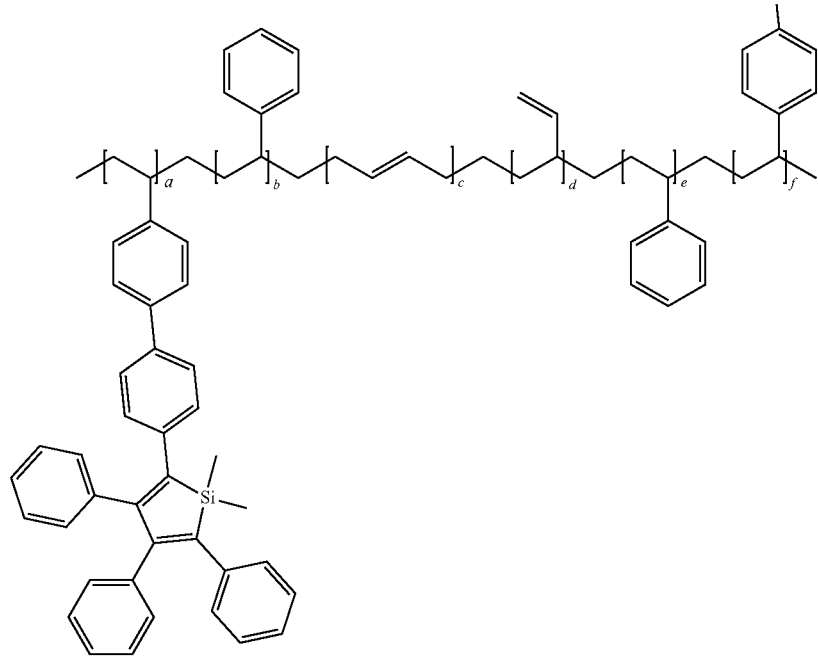
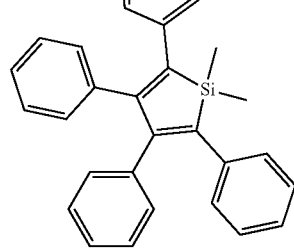

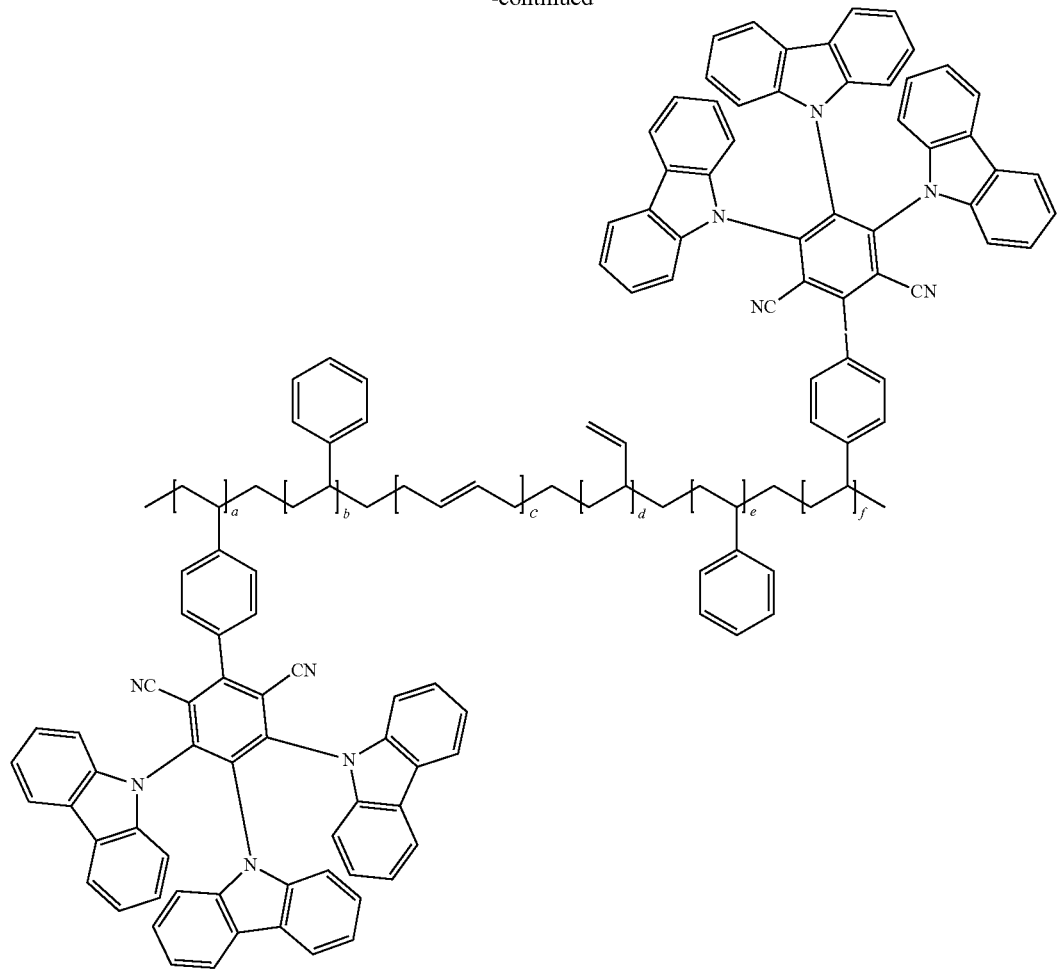

Further, the structural formula of the elastomer also satisfies: a+b+e+f=0.1~0.3.

The present invention provides a method for preparing block copolymerized intrinsically stretchable electroluminescent elastomer. The elastomer uses monomer

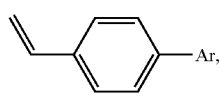

styrene, and 1,3-butadiene as raw materials, and a series of block copolymer intrinsically stretchable electroluminescent elastomers are prepared by anionic polymerization.

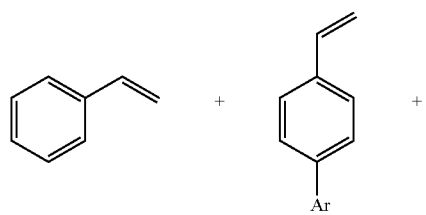

-continued

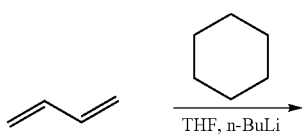

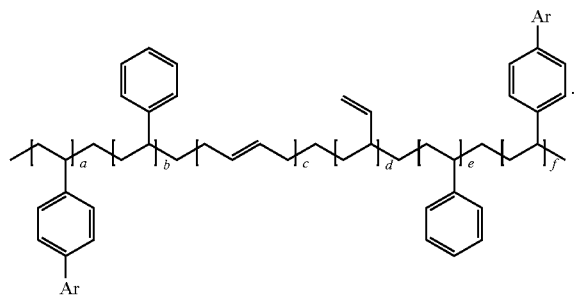

Specifically, the preparation method of this kind of block copolymer intrinsic stretchable electroluminescent elastomer is carried out according to the following steps:

(1) Under nitrogen protection, first, the monomer

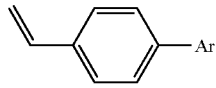

and styrene monomer are dissolved in an organic solvent in hexane, cyclohexane, toluene or dioxane. An additive in tetrahydrofuran, ether or acetonitrile and an initiator of n-butyl lithium or tert-butyl lithium are respectively injected into the reaction vessel, and reacted at 55-75° C. for 1-2 h. Subsequently, 1,3-butadiene monomer is added to the reaction vessel and reacted for 2-3 h at 50-70° C. Finally, the monomer

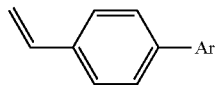

and styrene are added to the reaction vessel again, and reacted at 55-75° C. for 1-2 h.

(2) After the reaction, absolute ethanol is used to quench the unreacted n-butyl lithium. After it is cooled to room temperature, the reaction solution is concentrated, organic solvents are used for dissolution, methanol is used for sedimentation, and column chromatography is used for purification. Subsequently, the solvents of n-hexane, methanol and acetone are used for Soxhlet extraction for 24-72 h. The methanol solvent is used again for sedimentation, after suction filtration and drying, the obtained elastomer is the target product.

Among them, 1 mmol monomer

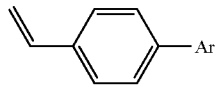

is dissolved in 5-25 mL of organic solvent, and 0.02-0.08 mL of additives and 0.02-0.08 mL of initiator are added. Organic solvents include hexane, cyclohexane, toluene, and dioxane, additives include tetrahydrofuran, ether, and acetonitrile, and initiators include n-butyl lithium and tert-butyl lithium.

The present invention also provides the application of this type of block copolymer intrinsic stretchable electroluminescent elastomer, which is characterized in that the type of elastomer is used as an optoelectronic functional layer material in the field of stretchable organic electromechanical luminescent devices, software robots and artificial intelligence.

Beneficial Effects

This patent invented a block copolymer intrinsic stretchable electroluminescent elastomer as a photoelectric functional layer material and applied to stretchable electroluminescent devices. The organic electroluminescence unit is introduced into the traditional elastomer through chemical crosslinking, which not only improves the intrinsic stretchability of the elastomer, but also has characteristics of excellent luminescence and high carrier mobility, meanwhile, it solves the technical problems of compatibility between the inherent inextensibility of traditional organic optoelectronic materials and the electroluminescence properties that traditional elastomers do not have. This type of elastomer has a unique design strategy, novel structure, excellent thermal stability, luminescence properties, film-forming properties and high intrinsic stretchability. It is a type of electroluminescent elastomer with important application potential. In addition, the elastomer is used as a luminescent layer material, and the preparation of stretchable electroluminescent devices with high stretchability, high stability and high efficiency is realized by solution processing.

DETAILED DESCRIPTION OF THE INVENTION

Figure 1:
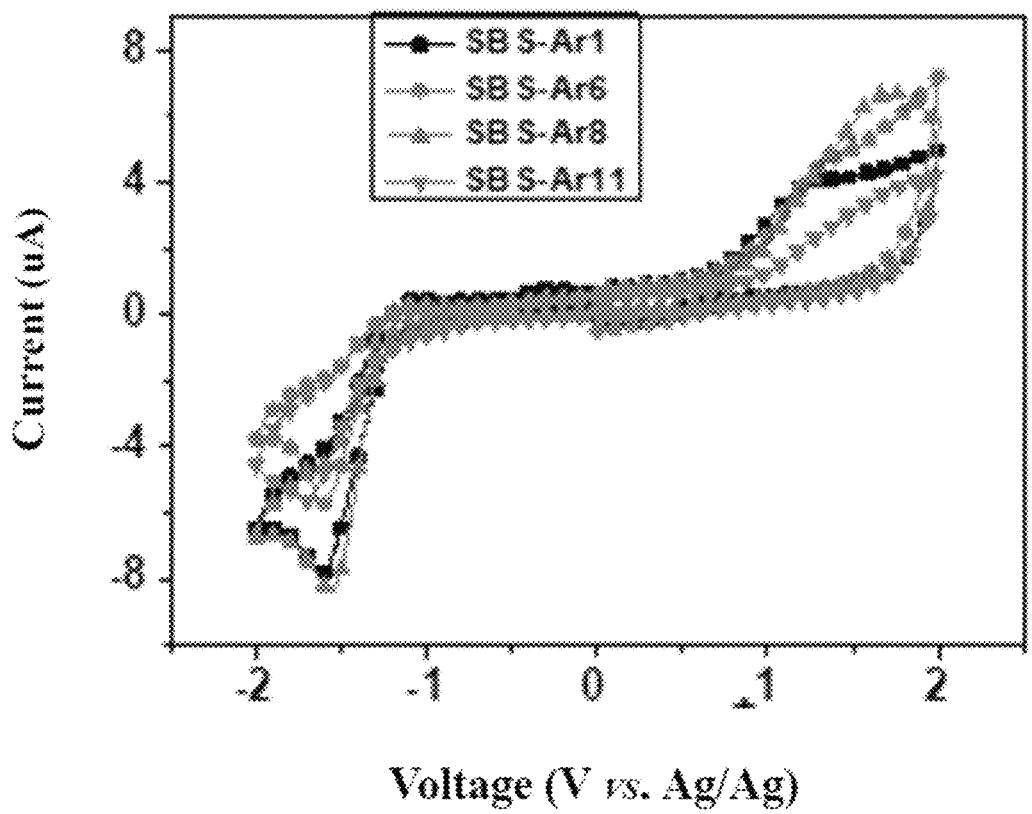
FIG. 1 is the cyclic voltammetry curve (CV curve) of the elastomer.
Figure 2:
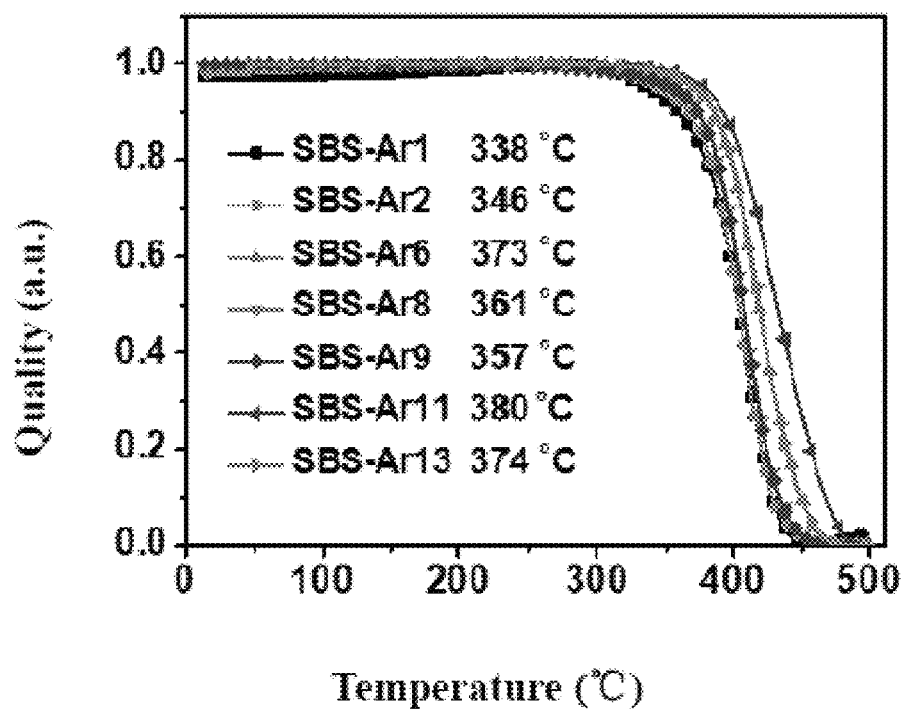
FIG. 2 is the thermal weight loss curve of the elastomer.
Figure 3:
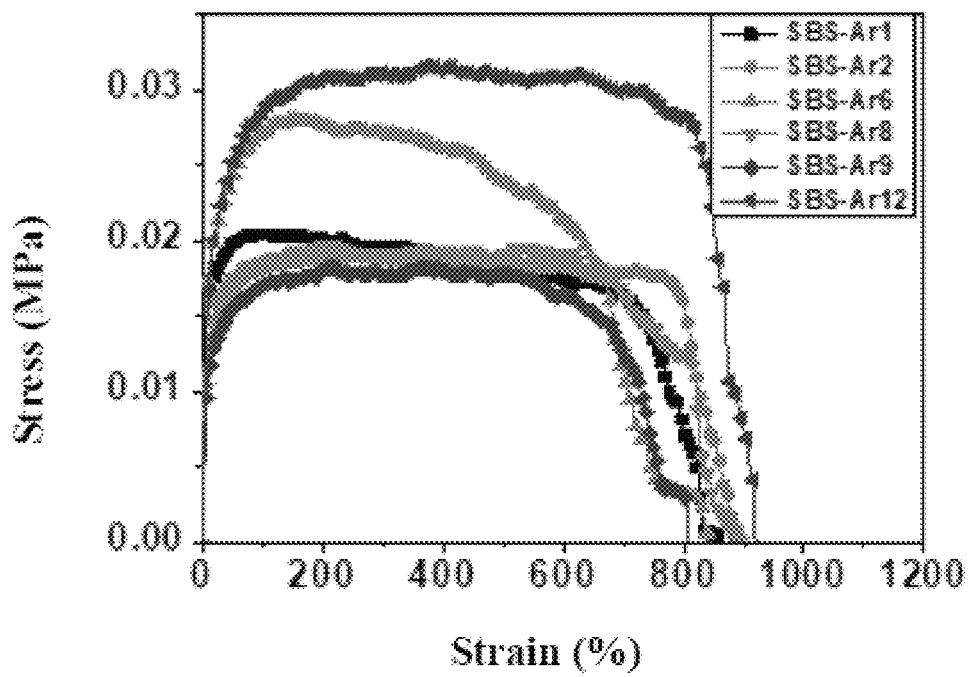
FIG. 3 is the tensile test curve diagram of the elastomer.
Figure 4:
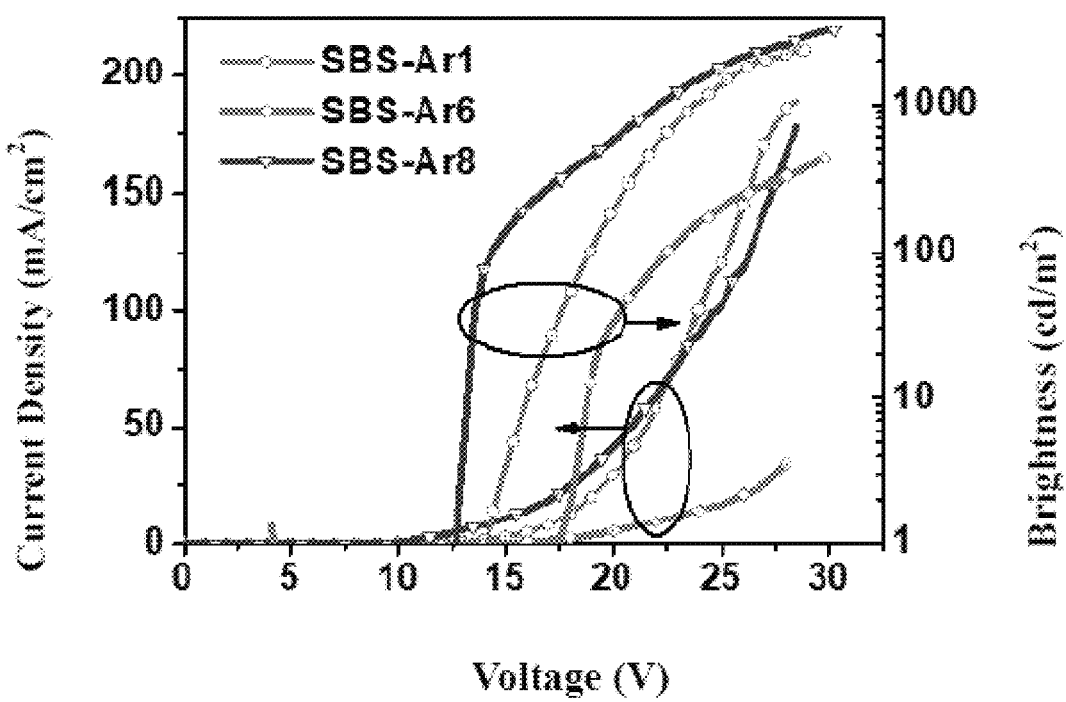
FIG. 4 is the current density/brightness-voltage curve of the organic electroluminescence properties of elastomers.

A block copolymer intrinsically stretchable electroluminescent elastomer, which has the following general structural formula:

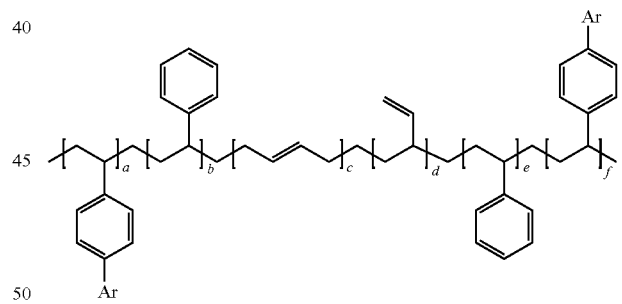

Among them, a, b, c, d, e, f represent the molar ratio of the block component, $a+b+c+d+e+f=1$; Ar is selected from one of the following groups:

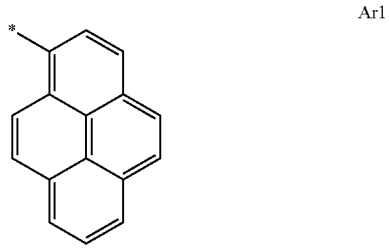

Ar1

Ar2 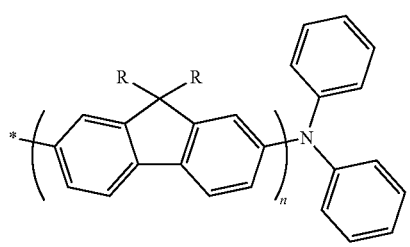
Ar3 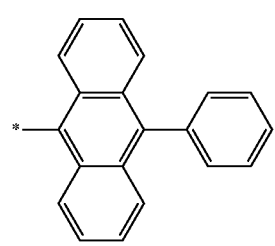
Ar4 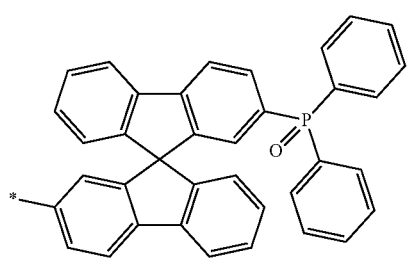
Ar5 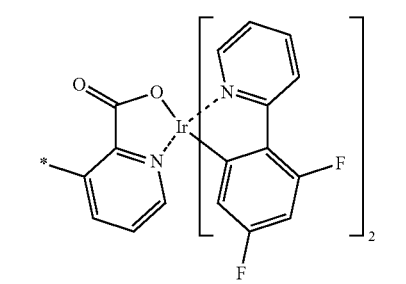
Ar6 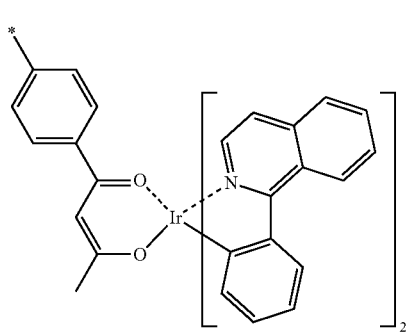
Ar7 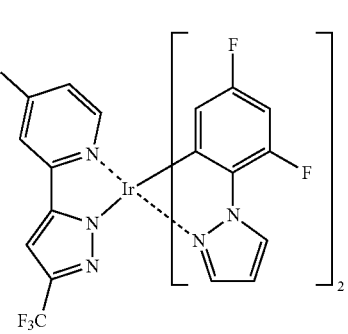
Ar8 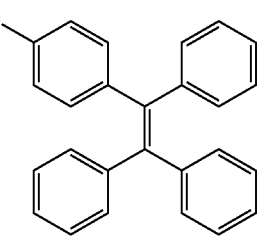
Ar9 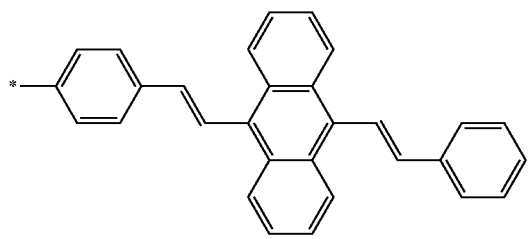
Ar10 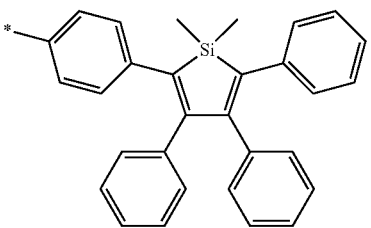
Ar11 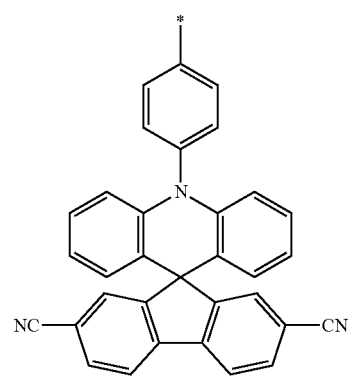

17
-continued

Ar12

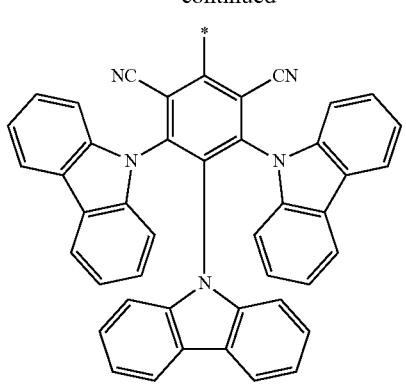

Ar13 among them, R is a $C_1$-$C_{20}$ linear or branched alkyl group, the number of n is 1-6, and * is the connection position.

The preparation method of this type of block copolymerization intrinsically stretchable electroluminescent elastomer is: the monomer

styrene, and 1,3-butadiene are used as building units. Under the conditions of organic solvents, additives and initiators, a series of intrinsically stretchable electroluminescent elastomers are prepared by anionic polymerization.

Embodiment 1

If Ar is selected as

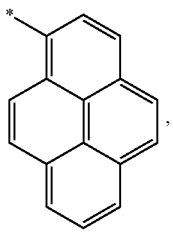 [SMILES: *c1ccc2ccc3cccc4ccc1c2c34]

the preparation of elastomer SBS-Ar1:

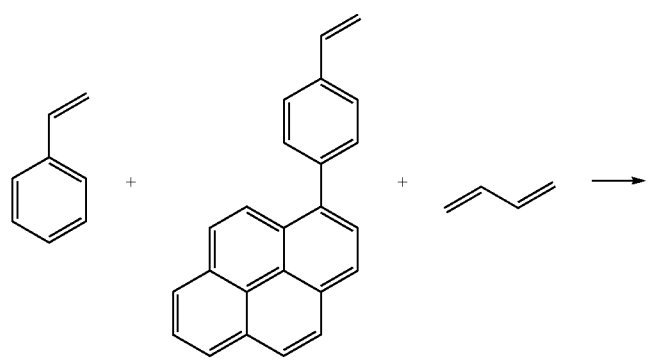

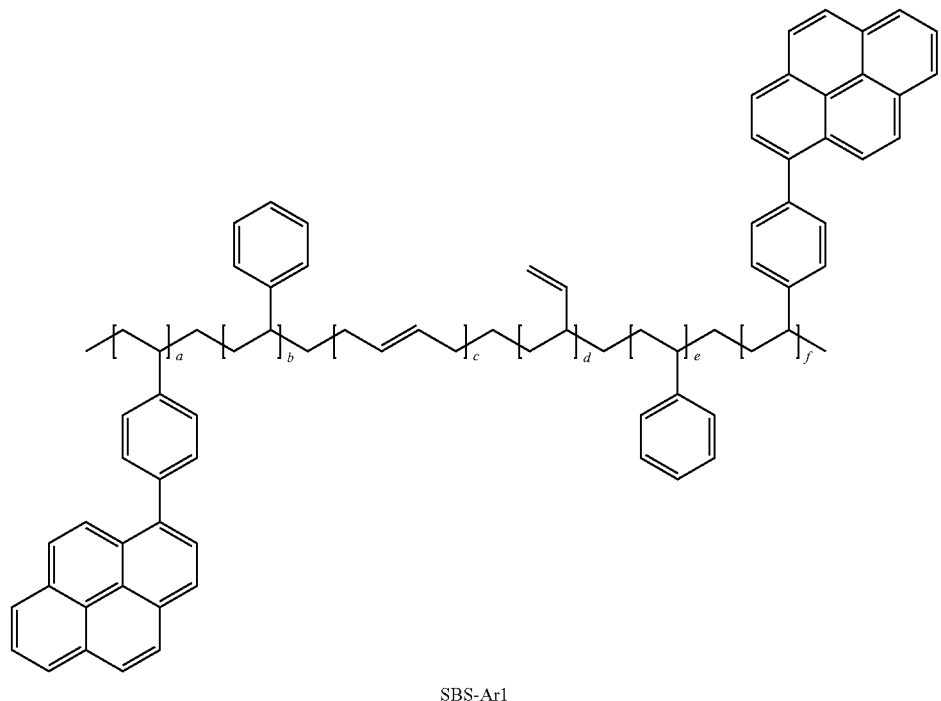

SBS-Ar1

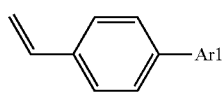

(500 mg, 1.64 mmol) is put into two 50 mL reaction flasks and sealed, and nitrogen is pumped three times. Styrene (0.5 mL, 4.37 mmol), ultra-dry cyclohexane (10 mL), ultra-dry THF (0.03 mL), 0.03 mL of n-BuLi are injected into the reaction flask, and reacted at 65° C. for 1 h. Subsequently, the temperature is bared to 63° C., 7 mL of 1,3-butadiene is added, and the reaction is carried out for 2 h. Finally,

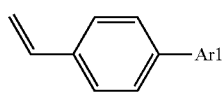

(500 mg, 1.64 mmol) and styrene (0.5 mL, 4.37 mmol) are added to the reaction flask and reacted at 65° C. for 1 h. After the reaction, the unreacted n-BuLi is quenched by adding absolute ethanol. After the reaction solution is concentrated, it is dissolved in DCM, precipitated in methanol, and purified by column chromatography. Subsequently, Soxhlet extraction is performed with n-hexane, methanol, and acetone for 48 h. The product is settled with methanol solvent again, filtered with suction and dried in vacuum to obtain elastomer SBS-Ar1 (15.08 g, the yield is 82%), and the ratio of the actual value of the final product to the total feeding amount is the yield.

Embodiment 2

If Ar is selected as

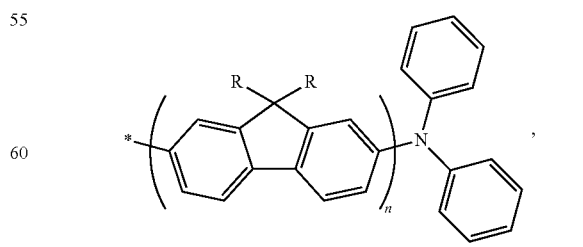

the preparation of elastomer SBS-Ar2 (among them, R is a C6 linear alkyl group and the number of n is 1):

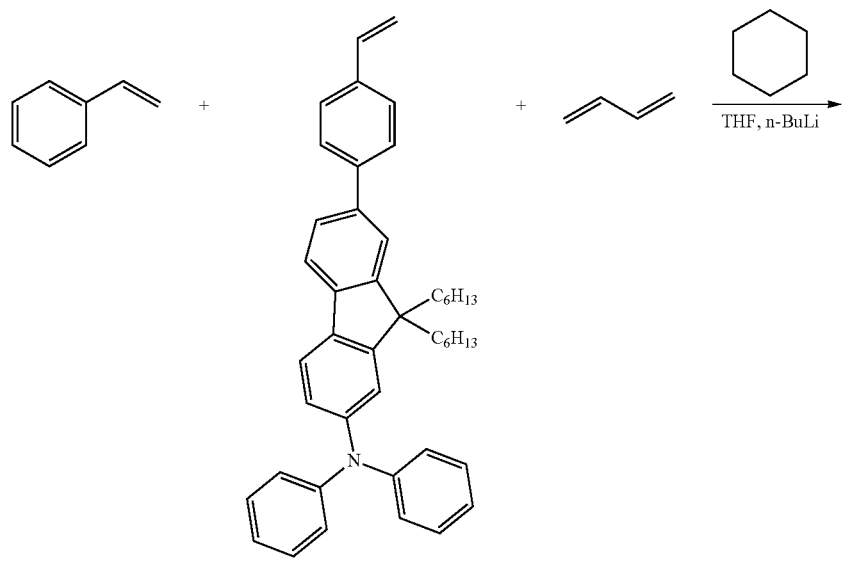
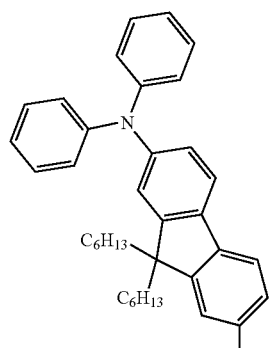
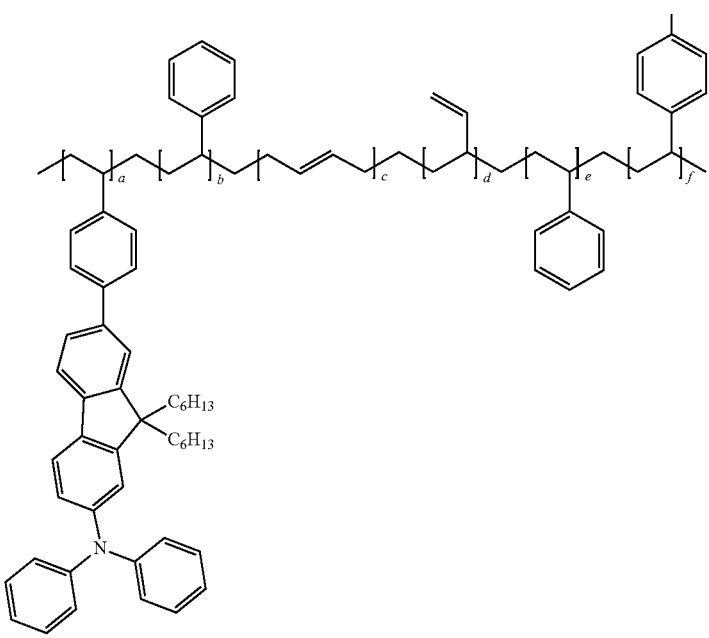
SBS-Ar2

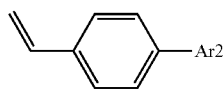

(250 mg, 0.41 mmol) is put into two 50 mL reaction flasks and sealed, and nitrogen is pumped three times. Styrene (0.5 mL, 4.37 mmol), ultra-dry cyclohexane (10 mL), ultra-dry THF (0.02 mL), 0.02 mL of n-BuLi are injected into the reaction flask, and reacted at 65° C. for 1 h. Subsequently, the temperature is bared to 63° C., 7 mL of 1,3-butadiene is added, and the reaction is carried out for 2 h. Finally,

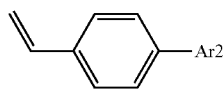

(250 mg, 0.41 mmol) and styrene (0.5 mL, 4.37 mmol) are added to the reaction flask and reacted at 65° C. for 1 h. After the reaction, the unreacted n-BuLi is quenched by adding absolute ethanol. After the reaction solution is concentrated, it is dissolved in DCM, precipitated in methanol, and purified by column chromatography. Subsequently, Soxhlet extraction is performed with n-hexane, methanol, and acetone for 48 h. The product is settled with methanol solvent again, filtered with suction and dried in vacuum to obtain elastomer SBS-Ar2 (4.12 g, the yield is 73%).

Embodiment 3

If Ar is selected as

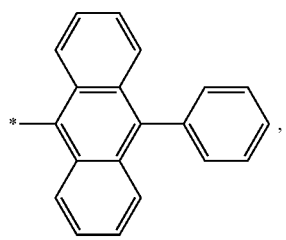 [SMILES: *c1c2ccccc2c(-c2ccccc2)c2ccccc12]

the preparation of elastomer SBS-Ar3:

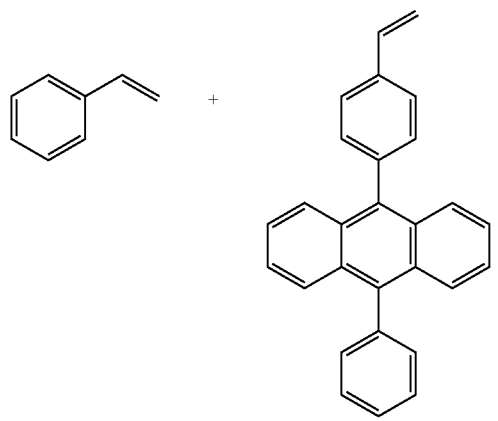

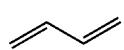
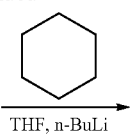

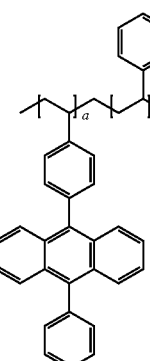

SBS-Ar3

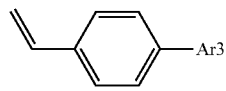

(1 g, 2.81 mmol) is put into two 50 mL reaction flasks and sealed, and nitrogen is pumped three times. Styrene (0.5 mL, 4.37 mmol), ultra-dry cyclohexane (12 mL), ultra-dry THF (0.08 mL), 0.08 mL of n-BuLi are injected into the reaction flask, and reacted at 65° C. for 1 h. Subsequently, the temperature is bared to 63° C., 7 mL of 1,3-butadiene is added, and the reaction is carried out for 2 h. Finally,

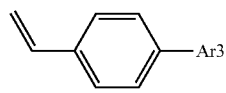

(1 g, 2.81 mmol) and styrene (0.5 mL, 4.37 mmol) are added to the reaction flask and reacted at 65° C. for 1 h. After the reaction, the unreacted n-BuLi is quenched by adding absolute ethanol. After the reaction solution is concentrated, it is dissolved in DCM, precipitated in methanol, and purified by column chromatography. Subsequently, Soxhlet extraction is performed with n-hexane, methanol, and acetone for 48 h. The product is settled with methanol solvent again, filtered with suction and dried in vacuum to obtain elastomer SBS-Ar3 (5.25 g, the yield is 73%).

Embodiment 4

If Ar is selected as

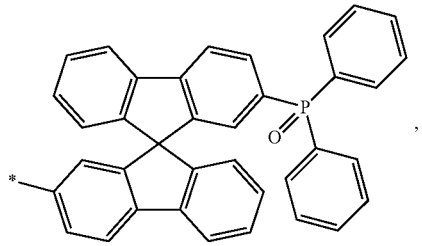 [SMILES: *c1ccc2c(c1)C1(c3ccccc3-2)c2ccccc2-c2ccc(P(=O)(c3ccccc3)c3ccccc3)cc21]

the preparation of elastomer SBS-Ar4:

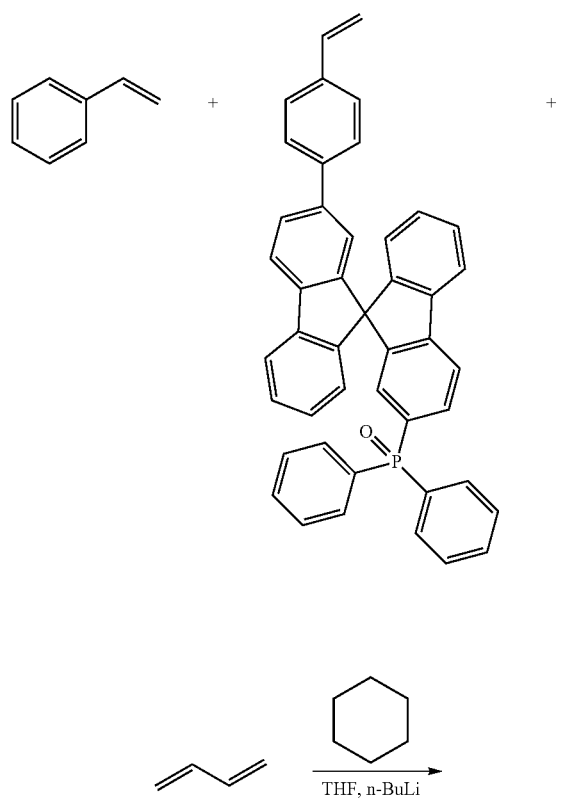

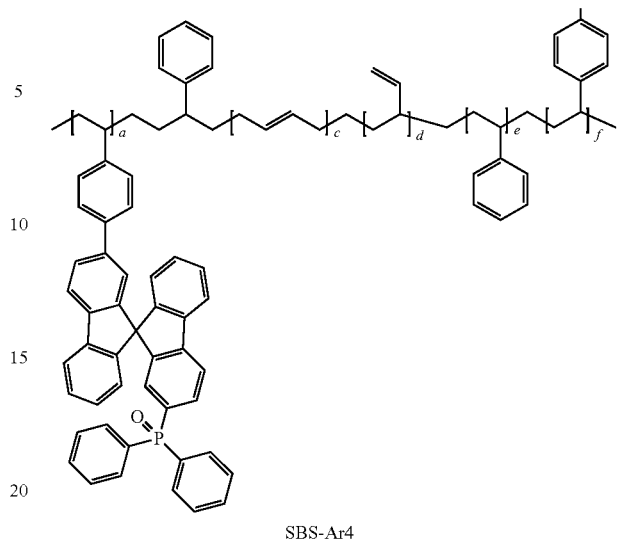

SBS-Ar4

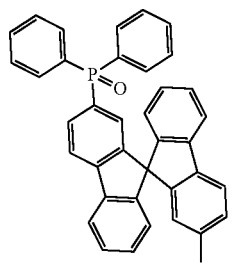

(1.5 g, 2.43 mmol) is put into two 50 mL reaction flasks and sealed, and nitrogen is pumped three times. Styrene (0.5 mL, 4.37 mmol), ultra-dry cyclohexane (15 mL), ultra-dry THF (0.12 mL), 0.12 mL of n-BuLi are injected into the reaction flask, and reacted at 65° C. for 1 h. Subsequently, the temperature is bared to 63° C., 7 mL of 1,3-butadiene is added, and the reaction is carried out for 2 h. Finally, (1.5 g, 2.43 mmol) and styrene (0.5 mL, 4.37 mmol) are added to the reaction flask and reacted at 65° C. for 1 h. After the reaction, the unreacted n-BuLi is quenched by adding absolute ethanol. After the reaction solution is concentrated, it is dissolved in DCM, precipitated in methanol, and purified by column chromatography. Subsequently, Soxhlet extraction is performed with n-hexane, methanol, and acetone for 48 h. The product is settled with methanol solvent again, filtered with suction and dried in vacuum to obtain elastomer SBS-Ar4 (6.50 g, the yield is 79%).

Embodiment 5
If Ar is selected as
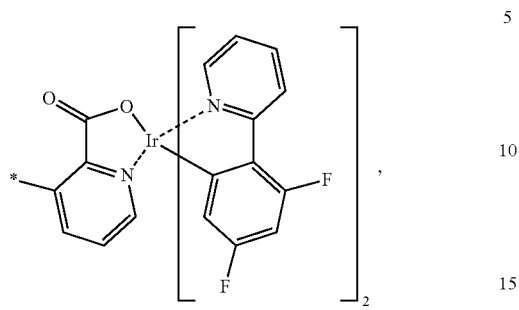
the preparation of elastomer SBS-Ar5:
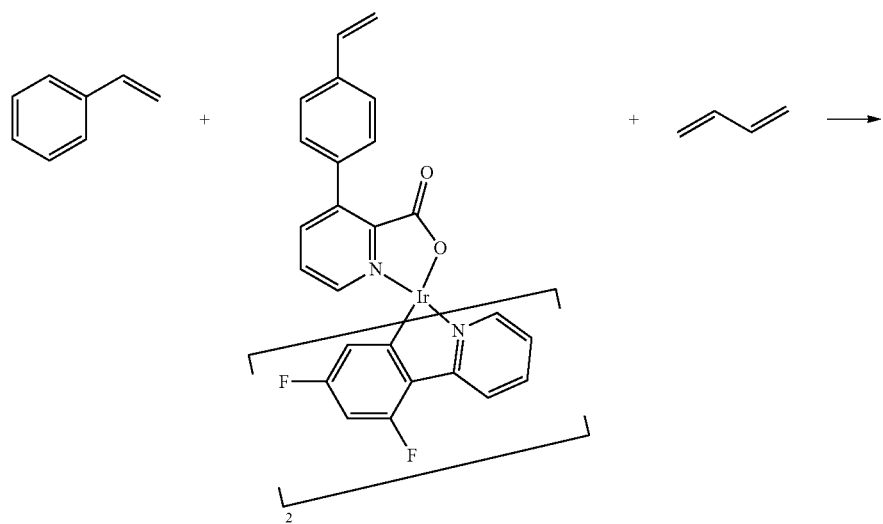
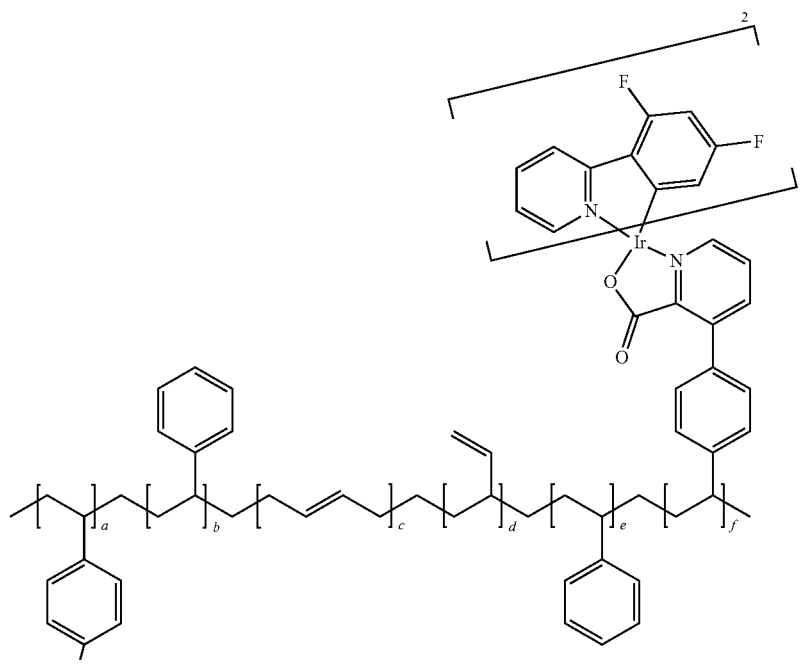

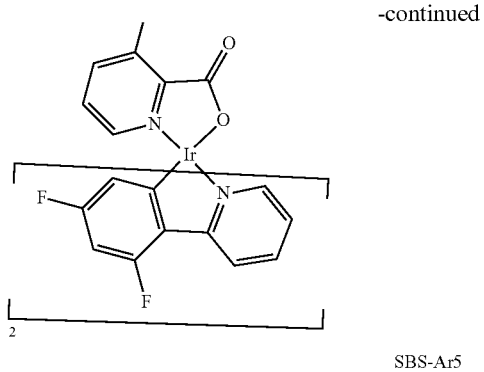

SBS-Ar5

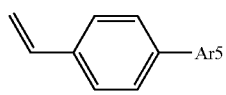

(1 g, 1.23 mmol) is put into two 50 mL reaction flasks and sealed, and nitrogen is pumped three times. Styrene (1 mL, 8.73 mmol), ultra-dry cyclohexane (12 mL), ultra-dry THF (0.07 mL), 0.07 mL of n-BuLi are injected into the reaction flask, and reacted at 65° C. for 1 h. Subsequently, the temperature is bared to 63° C., 7 mL of 1,3-butadiene is added, and the reaction is carried out for 2 h. Finally,

(1 g, 1.23 mmol) and styrene (1 mL, 8.73 mmol) are added to the reaction flask and reacted at 65° C. for 1 h. After the reaction, the unreacted n-BuLi is quenched by adding absolute ethanol. After the reaction solution is concentrated, it is dissolved in DCM, precipitated in methanol, and purified by column chromatography. Subsequently, Soxhlet extraction is performed with n-hexane, methanol, and acetone for 48 h. The product is settled with methanol solvent again, filtered with suction and dried in vacuum to obtain elastomer SBS-Ar5 (6.18 g, the yield is 76%).

Embodiment 6

If Ar is selected as

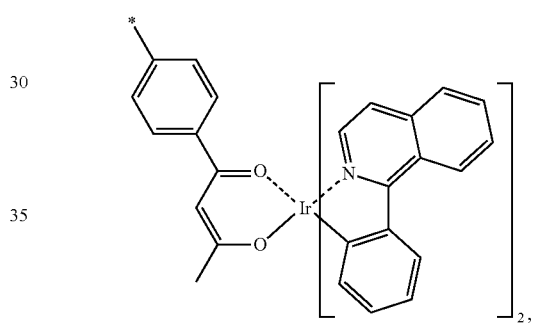

the preparation of elastomer SBS-Ar6:

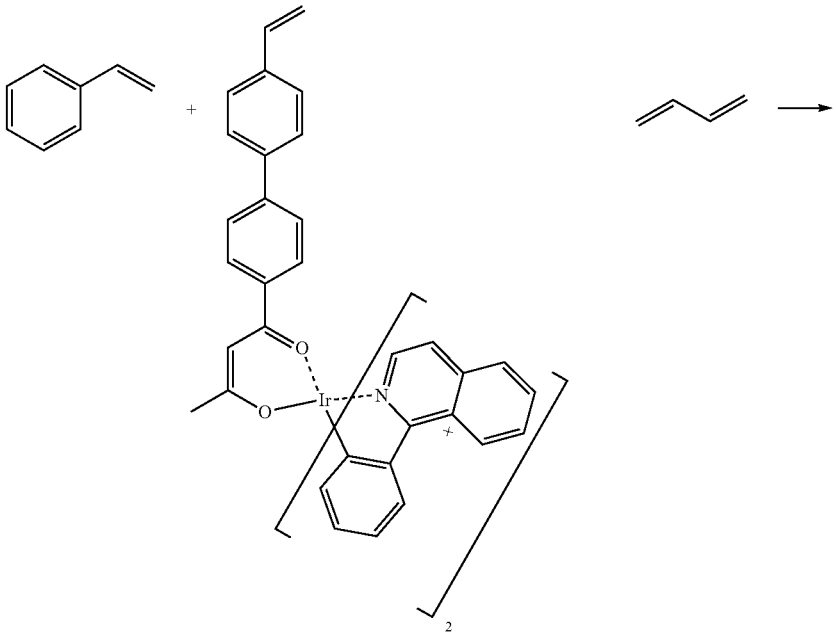

-continued

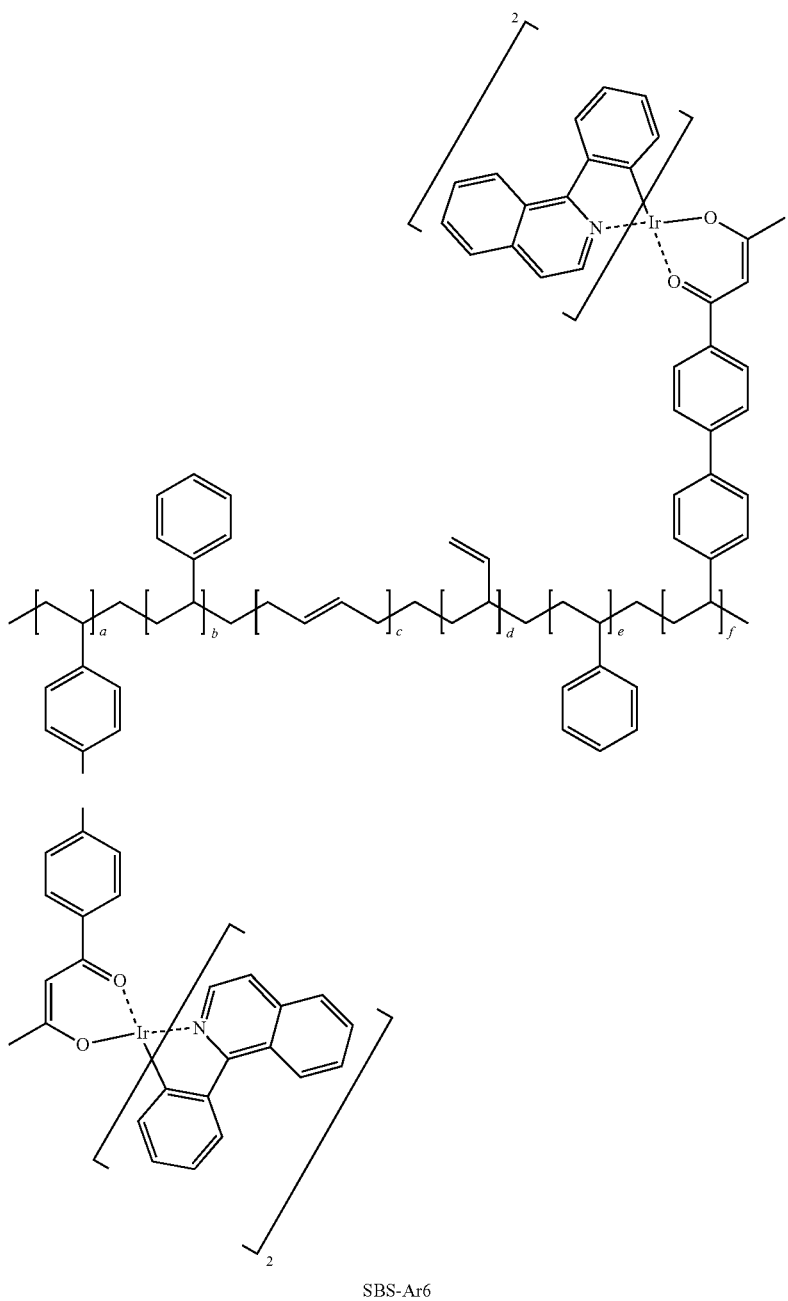

SBS-Ar6

(750 mg, 0.87 mmol) is put into two 50 mL reaction flasks and sealed, and nitrogen is pumped three times. Styrene (1 mL, 8.73 mmol), ultra-dry cyclohexane (12 mL), ultra-dry THF (0.07 mL), 0.07 mL of n-BuLi are injected into the reaction flask, and reacted at 65° C. for 1 h. Subsequently, the temperature is bared to 63° C., 7 mL of 1,3-butadiene is added, and the reaction is carried out for 2 h. Finally, (750 mg, 0.87 mmol) and styrene (1 mL, 8.73 mmol) are added to the reaction flask and reacted at 65° C. for 1 h. After the reaction, the unreacted n-BuLi is quenched by adding absolute ethanol. After the reaction solution is concentrated, it is dissolved in DCM, precipitated in methanol, and purified by column chromatography. Subsequently, Soxhlet extraction is performed with n-hexane, methanol, and acetone for 48 h. The product is settled with methanol solvent again, filtered with suction and dried in vacuum to obtain elastomer SBS-Ar6 (6.68 g, the yield is 88%).

Embodiment 7
If Ar is selected as
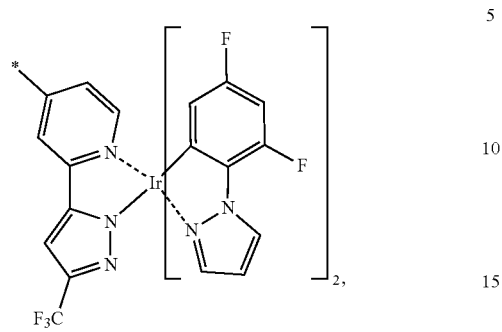
the preparation of elastomer SBS-Ar7:
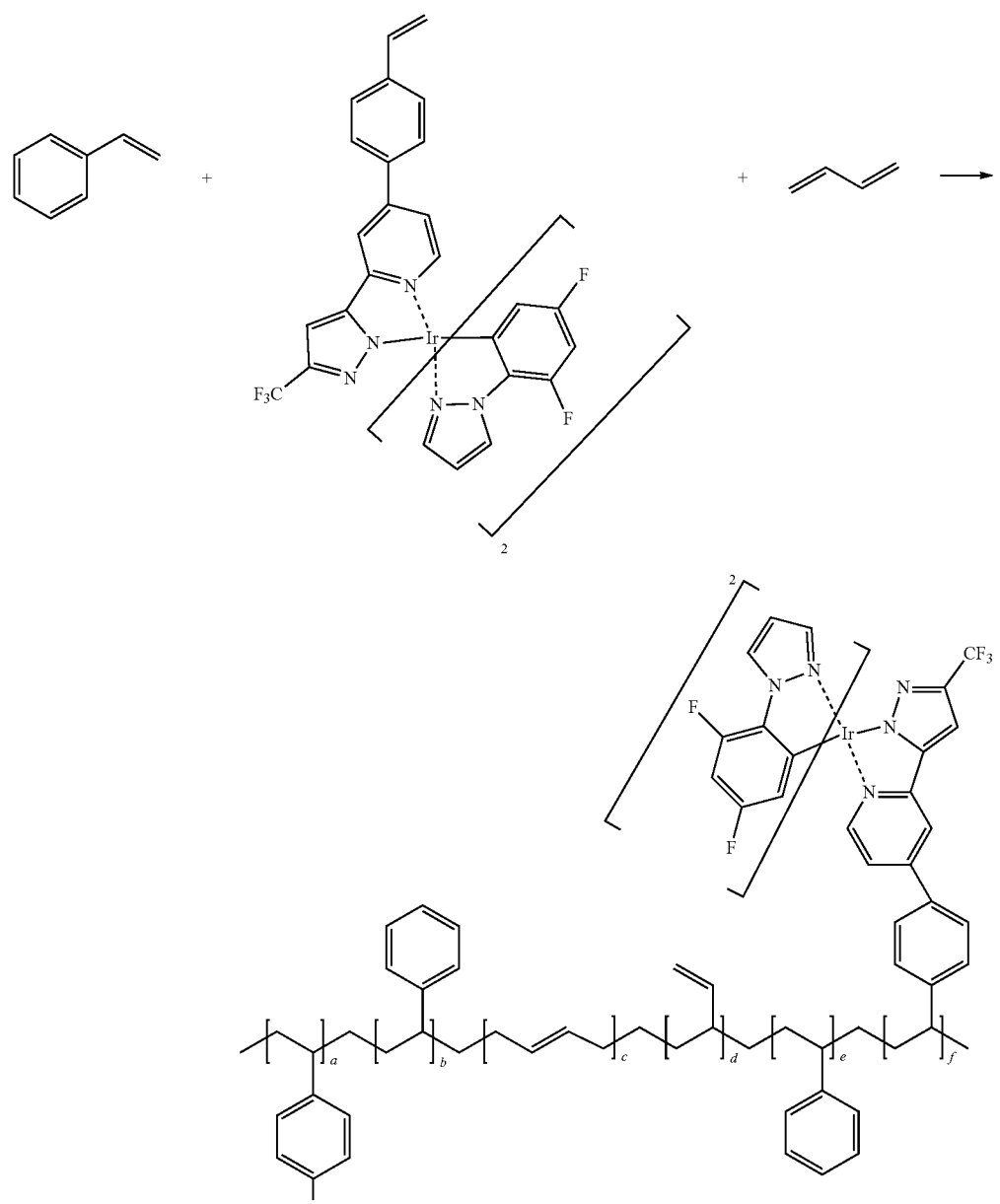

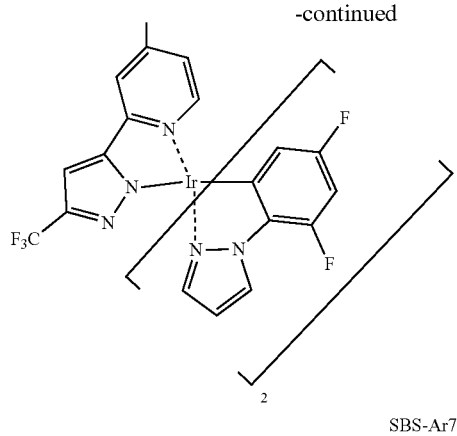

SBS-Ar7

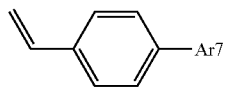

(500 mg, 0.58 mmol) is put into two 50 mL reaction flasks and sealed, and nitrogen is pumped three times. Styrene (1 mL, 8.73 mmol), ultra-dry cyclohexane (12 mL), ultra-dry THF (0.05 mL), 0.05 mL of n-BuLi are injected into the reaction flask, and reacted at 65° C. for 1 h. Subsequently, the temperature is bared to 63° C., 7 mL of 1,3-butadiene is added, and the reaction is carried out for 2 h. Finally,

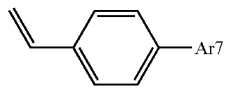

(500 mg, 0.58 mmol) and styrene (1 mL, 8.73 mmol) are added to the reaction flask and reacted at 65° C. for 1 h. After the reaction, the unreacted n-BuLi is quenched by adding absolute ethanol. After the reaction solution is concentrated, it is dissolved in DCM, precipitated in methanol, and purified by column chromatography. Subsequently, Soxhlet extraction is performed with n-hexane, methanol, and acetone for 48 h. The product is settled with methanol solvent again, filtered with suction and dried in vacuum to obtain elastomer SBS-Ar7 (5.87, the yield is 83%).

Embodiment 8

If Ar is selected as

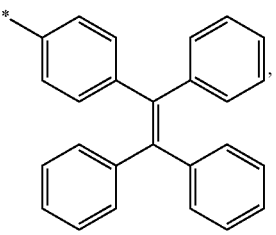 [SMILES: *c1ccc(C(=C(c2ccccc2)c2ccccc2)c2ccccc2)cc1]

the preparation of elastomer SBS-Ar8:

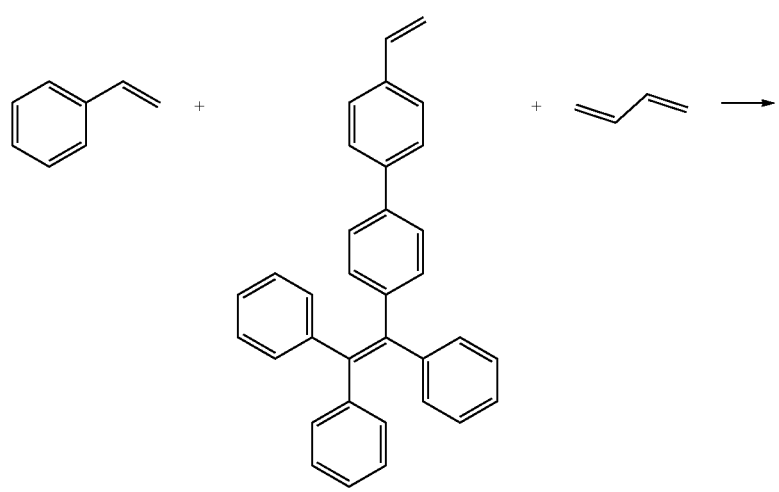

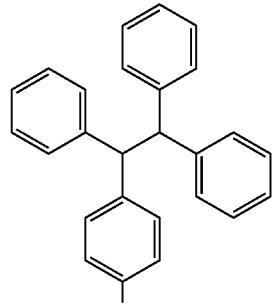

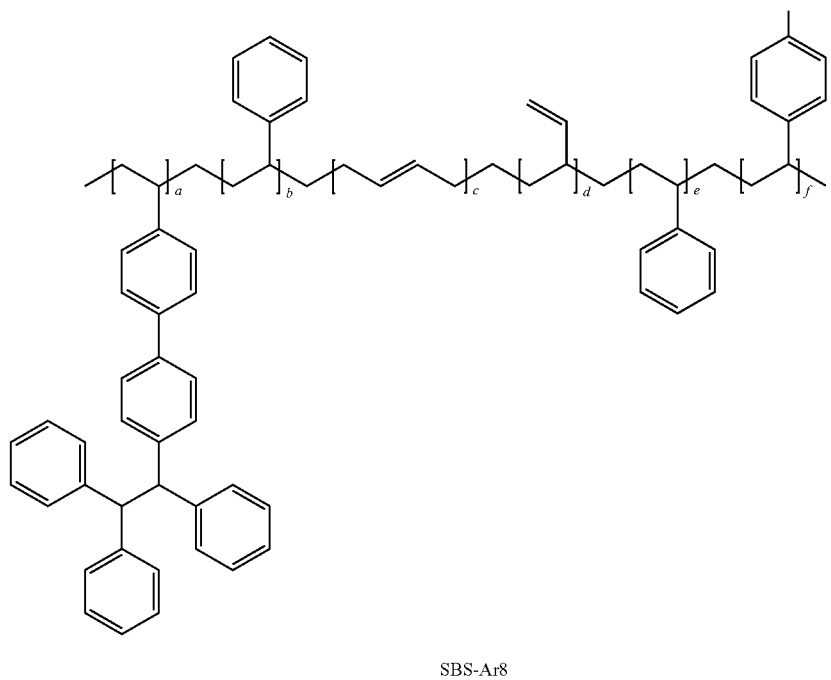

SBS-Ar8

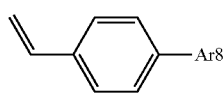

(500 mg, 1.16 mmol) is put into two 50 mL reaction flasks and sealed, and nitrogen is pumped three times. Styrene (1 mL, 8.73 mmol), ultra-dry cyclohexane (12 mL), ultra-dry THF (0.08 mL), 0.08 mL of n-BuLi are injected into the reaction flask, and reacted at 65° C. for 1 h. Subsequently, the temperature is bared to 63° C., 7 mL of 1,3-butadiene is added, and the reaction is carried out for 2 h. Finally,

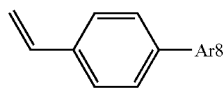

(500 mg, 1.16 mmol) and styrene (1 mL, 8.73 mmol) are added to the reaction flask and reacted at 65° C. for 1 h. After the reaction, the unreacted n-BuLi is quenched by adding absolute ethanol. After the reaction solution is concentrated, it is dissolved in DCM, precipitated in methanol, and purified by column chromatography. Subsequently, Soxhlet extraction is performed with n-hexane, methanol, and acetone for 48 h. The product is settled with methanol solvent again, filtered with suction and dried in vacuum to obtain elastomer SBS-Ar8 (4.96 g, the yield is 70%).

Embodiment 9

If Ar is selected as

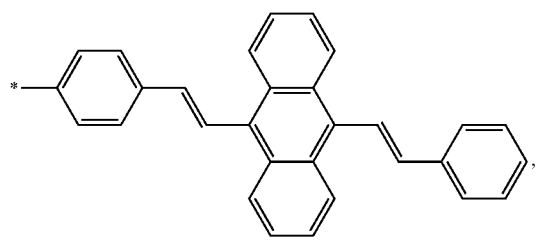 [SMILES: *c1ccc(/C=C/c2c3ccccc3c(/C=C/c3ccccc3)c3ccccc23)cc1]

the preparation of elastomer SBS-Ar9:
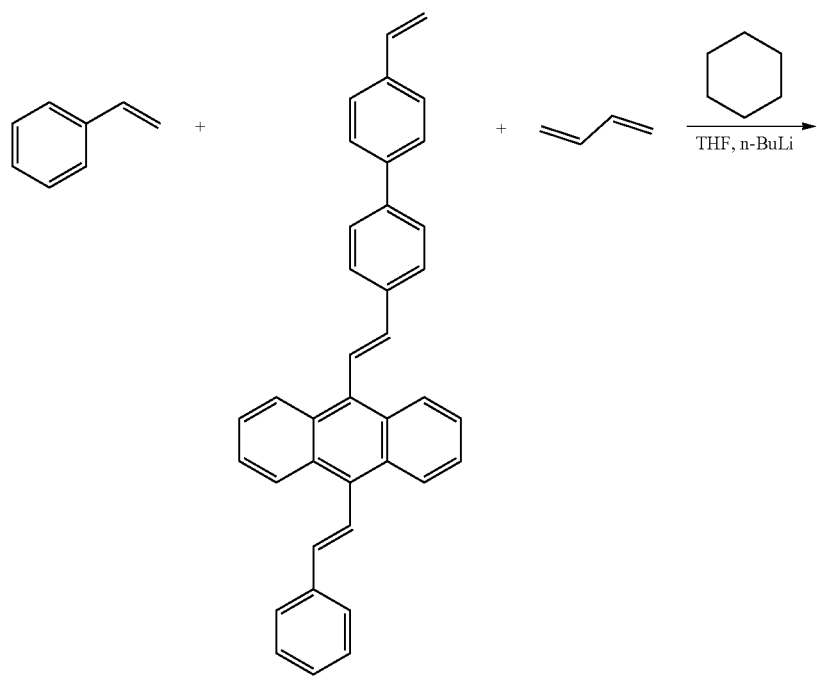
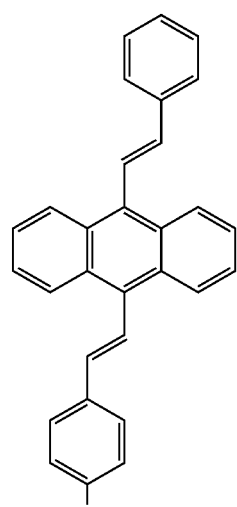

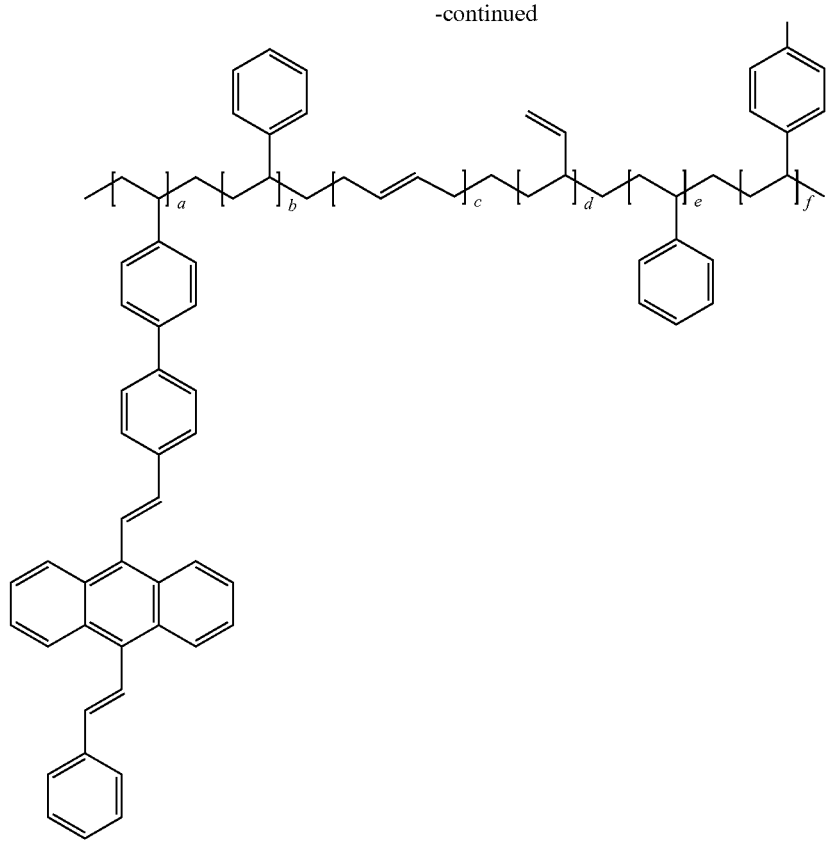

SBS-Ar9

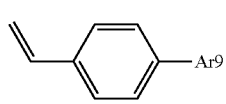

(1 g, 2.1 mmol) is put into two 50 mL reaction flasks and sealed, and nitrogen is pumped three times. Styrene (1 mL, 8.73 mmol), ultra-dry cyclohexane (15 mL), ultra-dry THF (0.1 mL), 0.1 mL of n-BuLi are injected into the reaction flask, and reacted at 65° C. for 1 h. Subsequently, the temperature is bared to 63° C., 7 mL of 1,3-butadiene is added, and the reaction is carried out for 2 h. Finally,

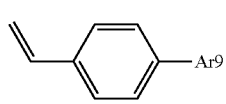

(1 g, 2.1 mmol) and styrene (1 mL, 8.73 mmol) are added to the reaction flask and reacted at 65° C. for 1 h. After the reaction, the unreacted n-BuLi is quenched by adding absolute ethanol. After the reaction solution is concentrated, it is dissolved in DCM, precipitated in methanol, and purified by column chromatography. Subsequently, Soxhlet extraction is performed with n-hexane, methanol, and acetone for 48 h. The product is settled with methanol solvent again, filtered with suction and dried in vacuum to obtain elastomer SBS-Ar9 (7.18 g, the yield is 89%).

Embodiment 10

If Ar is selected as

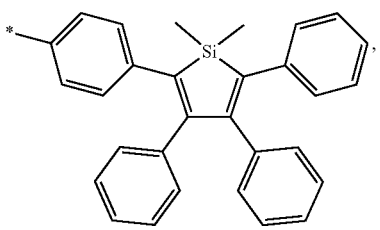 [SMILES: *c1ccc(C2=C(c3ccccc3)C(c3ccccc3)=C(c3ccccc3)[Si]2(C)C)cc1]

the preparation of elastomer SBS-Ar10:
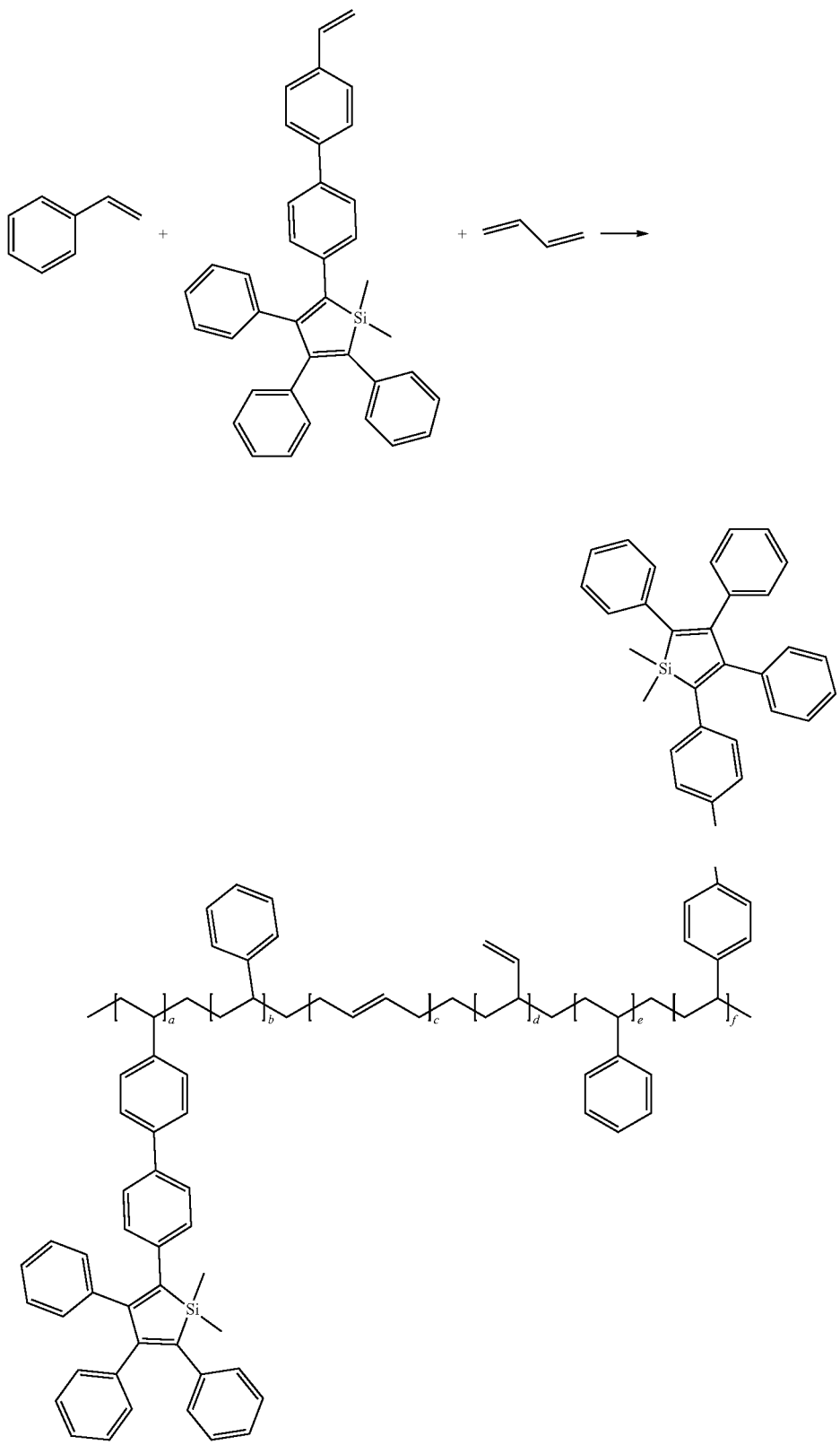
SBS-Ar10

(2 g, 3.9 mmol) is put into two 50 mL reaction flasks and sealed, and nitrogen is pumped three times. Styrene (1 mL, 8.73 mmol), ultra-dry cyclohexane (18 mL), ultra-dry THF (0.2 mL), 0.2 mL of n-BuLi are injected into the reaction flask, and reacted at 65° C. for 1 h. Subsequently, the temperature is bared to 63° C., 7 mL of 1,3-butadiene is added, and the reaction is carried out for 2 h. Finally,

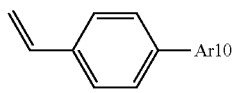

(2 g, 3.9 mmol) and styrene (1 mL, 8.73 mmol) are added to the reaction flask and reacted at 65° C. for 1 h. After the reaction, the unreacted n-BuLi is quenched by adding absolute ethanol. After the reaction solution is concentrated, it is dissolved in DCM, precipitated in methanol, and purified by column chromatography. Subsequently, Soxhlet extraction is performed with n-hexane, methanol, and acetone for 48 h.

The product is settled with methanol solvent again, filtered with suction and dried in vacuum to obtain elastomer SBS-Ar10 (7.88 g, the yield is 78%).

Embodiment 11

If Ar is selected as

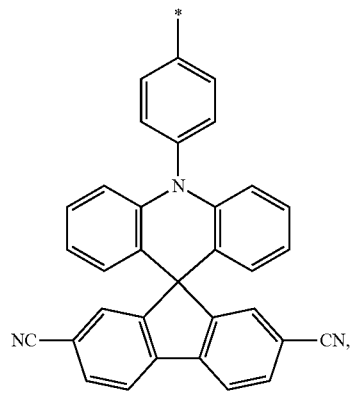 [SMILES: *c1ccc(N2c3ccccc3C3(c4cc(C#N)ccc4-c4ccc(C#N)cc43)c3ccccc32)cc1]

the preparation of elastomer SBS-Ar11:

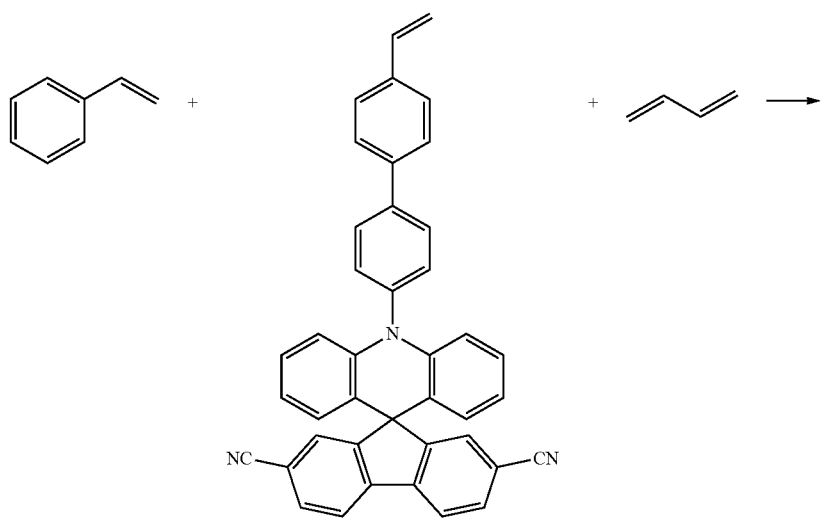

-continued

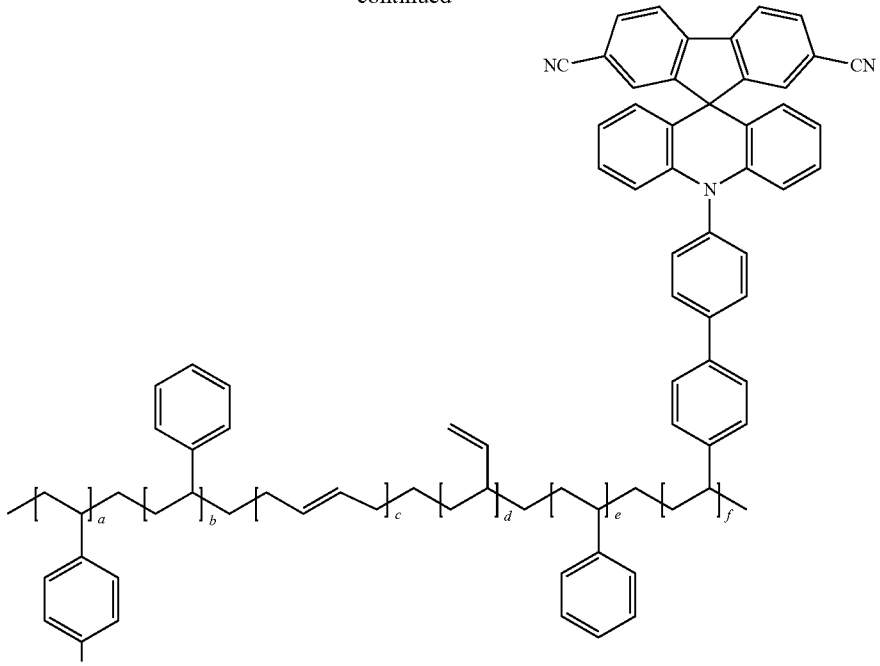

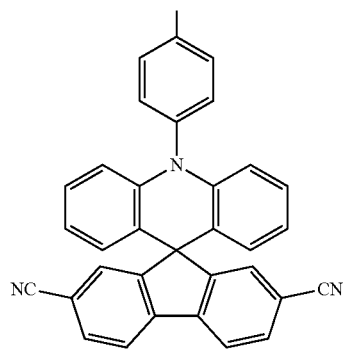

SBS-Ar11

55

(1 g, 1.79 mmol) is put into two 50 mL reaction flasks and sealed, and nitrogen is pumped three times. Styrene (1.5 mL, 13.11 mmol), ultra-dry cyclohexane (20 mL), ultra-dry THF (0.14 mL), 0.14 mL of n-BuLi are injected into the reaction flask, and reacted at 65° C. for 1 h. Subsequently, the temperature is bared to 63° C., 7 mL of 1,3-butadiene is added, and the reaction is carried out for 2 h. Finally, (1 g, 1.79 mmol) and styrene (1.5 mL, 13.11 mmol) are added to the reaction flask and reacted at 65° C. for 1 h. After the reaction, the unreacted n-BuLi is quenched by adding absolute ethanol. After the reaction solution is concentrated, it is dissolved in DCM, precipitated in methanol, and purified by column chromatography. Subsequently, Soxhlet extraction is performed with n-hexane, methanol, and acetone for 48 h. The product is settled with methanol solvent again, filtered with suction and dried in vacuum to obtain elastomer SBS-Ar11 (6.84 g, the yield is 76%).

Embodiment 12
If Ar is selected as
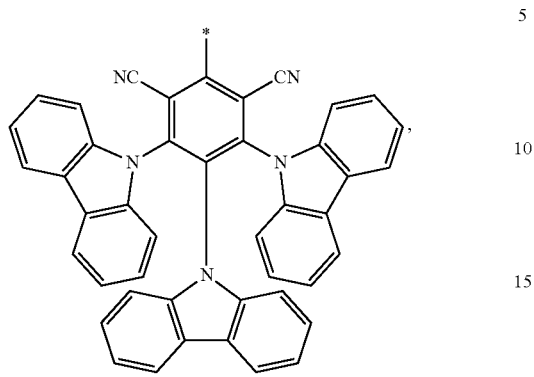
the preparation of elastomer SBS-Ar12:
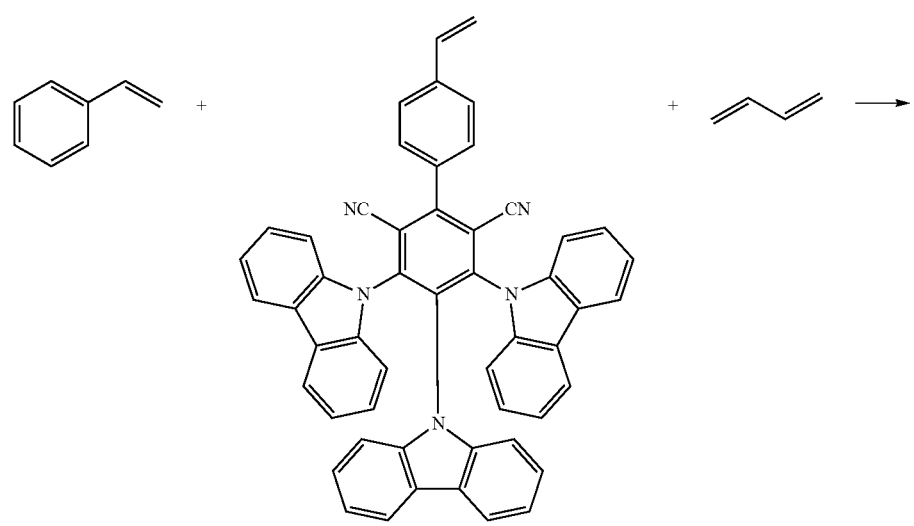

-continued

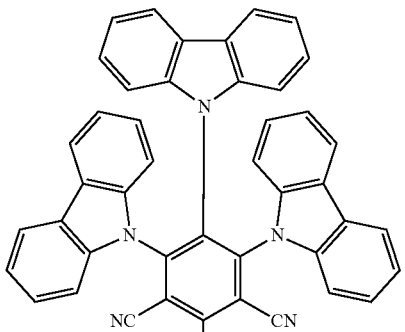

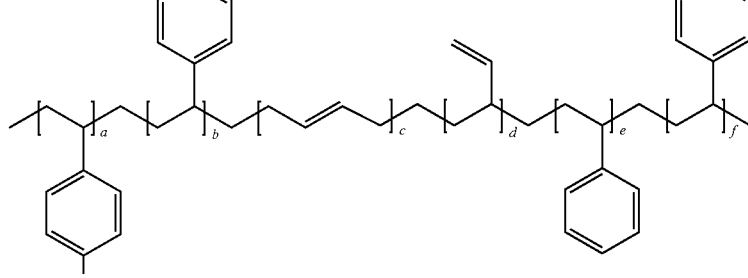

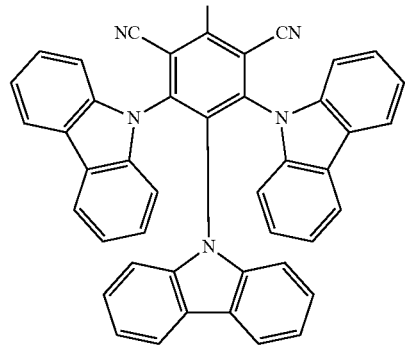

SBS-Ar12

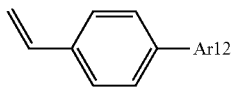

(1 g, 1.38 mmol) is put into two 50 mL reaction flasks and sealed, and nitrogen is pumped three times. Styrene (1.5 mL, 13.11 mmol), ultra-dry cyclohexane (20 mL), ultra-dry THF (0.10 mL), 0.10 mL of n-BuLi are injected into the reaction flask, and reacted at 65° C. for 1 h. Subsequently, the temperature is bared to 63° C., 7 mL of 1,3-butadiene is added, and the reaction is carried out for 2 h. Finally, (1 g, 1.38 mmol) and styrene (1.5 mL, 13.11 mmol) are added to the reaction flask and reacted at 65° C. for 1 h. After the reaction, the unreacted n-BuLi is quenched by adding absolute ethanol. After the reaction solution is concentrated, it is dissolved in DCM, precipitated in methanol, and purified by column chromatography. Subsequently, Soxhlet extraction is performed with n-hexane, methanol, and acetone for 48 h. The product is settled with methanol solvent again, filtered with suction and dried in vacuum to obtain elastomer SBS-Ar12 (6.32 g, the yield is 70%).

Embodiment 13
If Ar is selected as
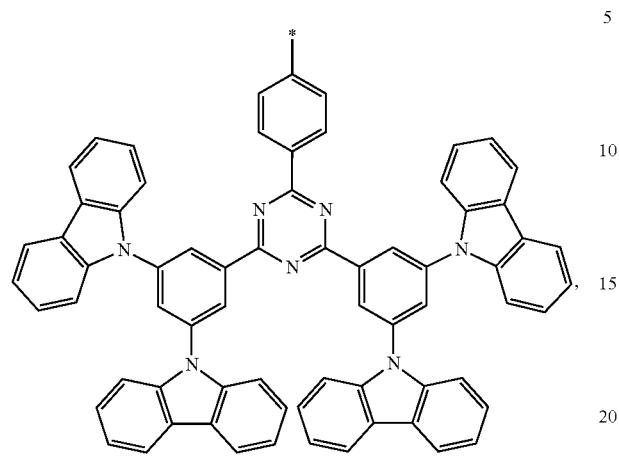
the preparation of elastomer SBS-Ar13:
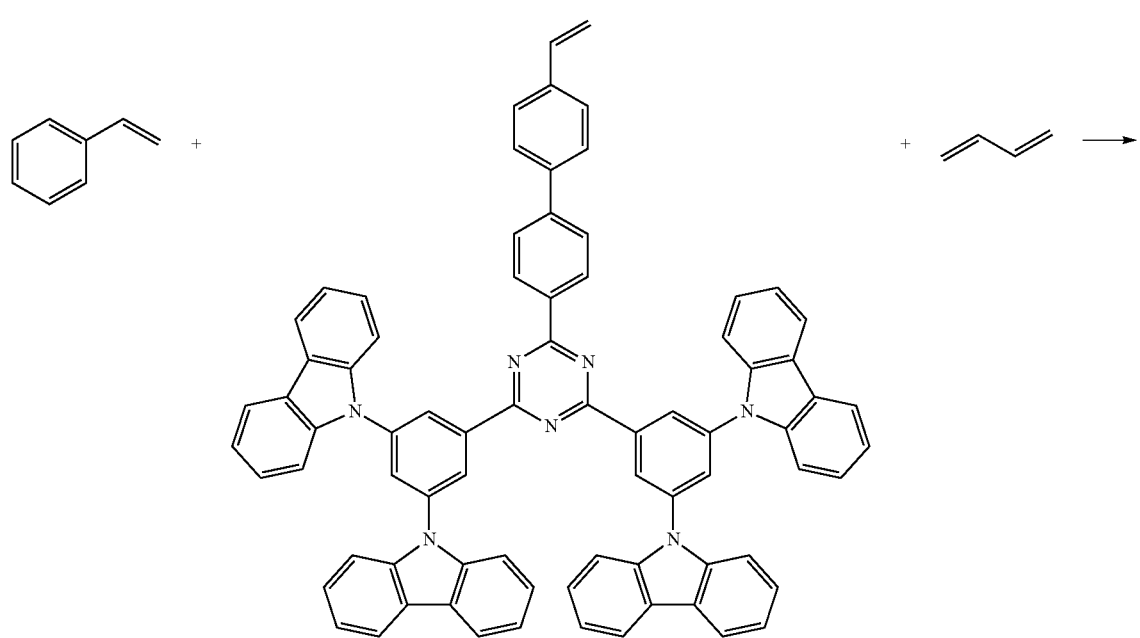

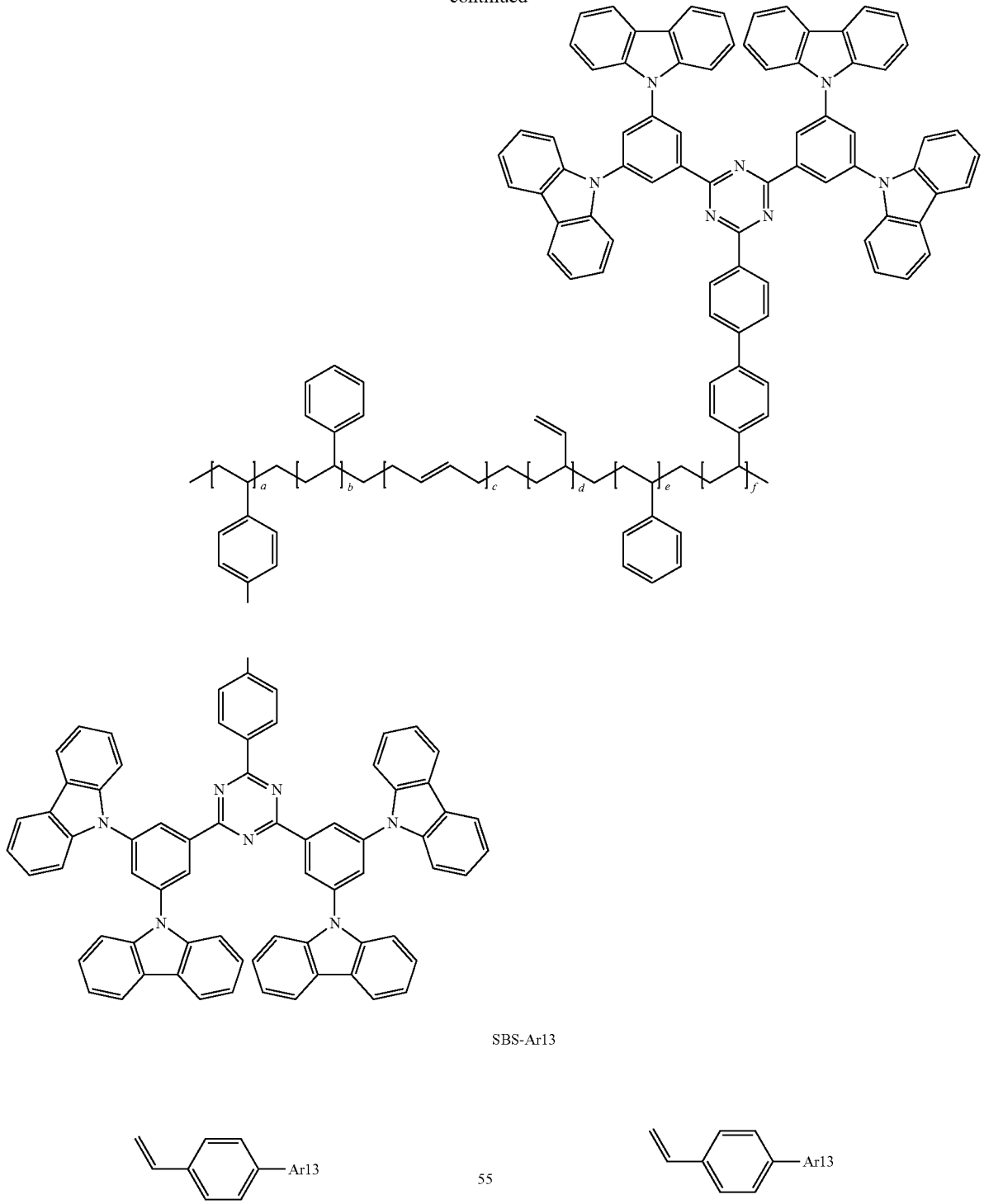

SBS-Ar13

(1 g, 0.93 mmol) is put into two 50 mL reaction flasks and sealed, and nitrogen is pumped three times. Styrene (1.5 mL, 13.11 mmol), ultra-dry cyclohexane (20 mL), ultra-dry THF (0.06 mL), 0.06 mL of n-BuLi are injected into the reaction flask, and reacted at 65° C. for 1 h. Subsequently, the temperature is bared to 63° C., 7 mL of 1,3-butadiene is added, and the reaction is carried out for 2 h. Finally, (1 g, 0.93 mmol) and styrene (1.5 mL, 13.11 mmol) are added to the reaction flask and reacted at 65° C. for 1 h. After the reaction, the unreacted n-BuLi is quenched by adding absolute ethanol. After the reaction solution is concentrated, it is dissolved in DCM, precipitated in methanol, and purified by column chromatography. Subsequently, Soxhlet extraction is performed with n-hexane, methanol, and acetone for 48 h. The product is settled with methanol solvent again, filtered with suction and dried in vacuum to obtain elastomer SBS-Ar13 (7.74 g, the yield is 86%).

Embodiment 14: OLED Device Preparation

After ultrasonic cleaning, the ITO glass is treated with oxygen plasma, and the sheet resistance of the ITO glass is 10 Ω/cm2. The hole injection layer is PEDOT or PVK, and the light-emitting layer adopts any one of SBS-Ar1, SBS-Ar2, SBS-Ar3, SBS-Ar4, SBS-Ar5, SBS-Ar6, SBS-Ar7, SBS-Ar8, SBS-Ar9, SBS-Ar10, SBS-Ar11, SBS-Ar12 or SBS-Ar13. Both the hole injection layer and the light emitting layer are made by spin coating. The cathode electrode adopts Ca/Al or LiF/Al respectively. Among them, the maximum luminous efficiency of the OLED device prepared based on SBS-Ar1 is 8.50 cd/A, and the maximum luminous brightness is 4776 cd/m2; the stretch rate of SBS-Ar12 can reach 900%.

The above are the embodiments of the present inventors. It should be noted that the present invention is not limited to these examples. These examples are only for a better understanding of the present invention. Any equivalent changes made according to the technical solutions of the present invention belong to the protection scope of the present invention.

The invention claimed is:

1. A block copolymer intrinsically stretchable electroluminescent elastomer of formula (1):

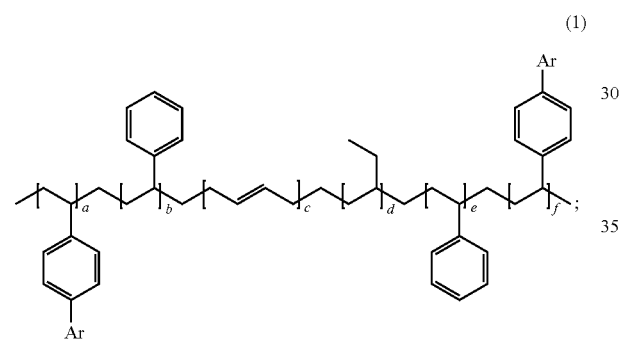

(1)

wherein a, b, c, d, e, and f each represent a molar ratio of a block component corresponding thereto, at least one of a and f is present, at least one of b and e is present and at least one of c and d is present, and a+b+c+d+e+f=1; and Ar is selected from the group consisting of:

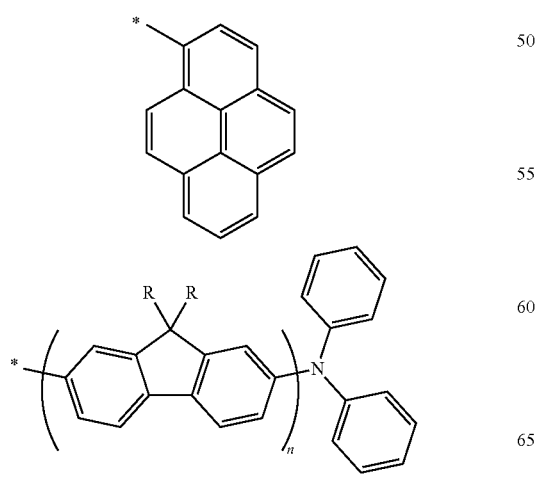

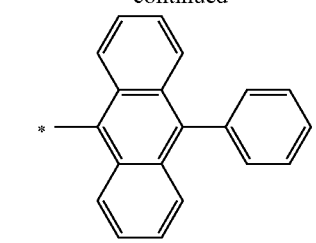

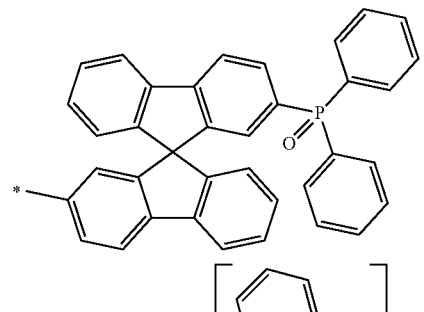

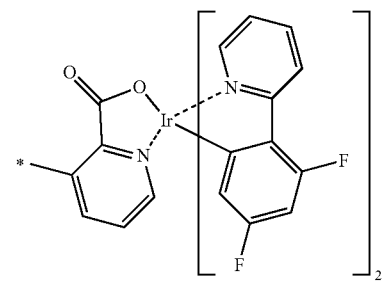

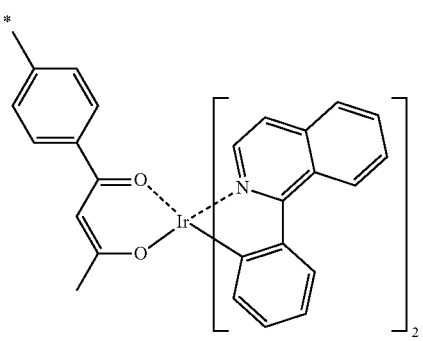

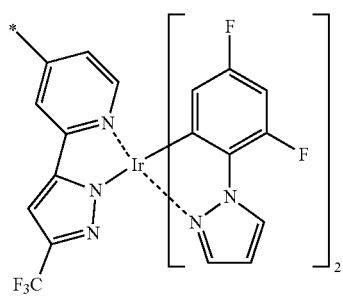

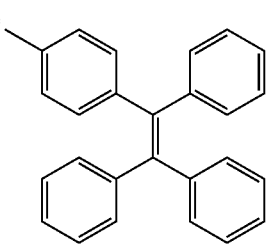

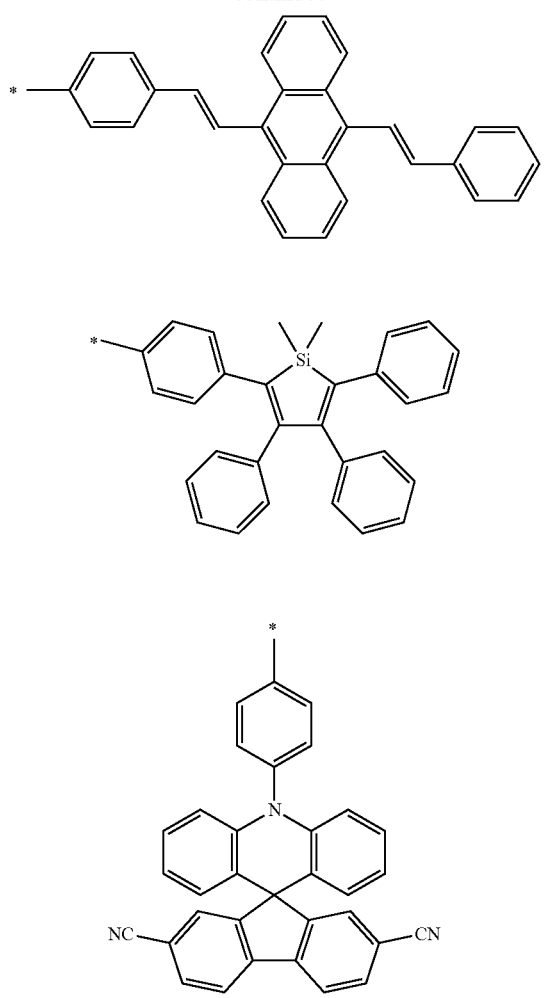

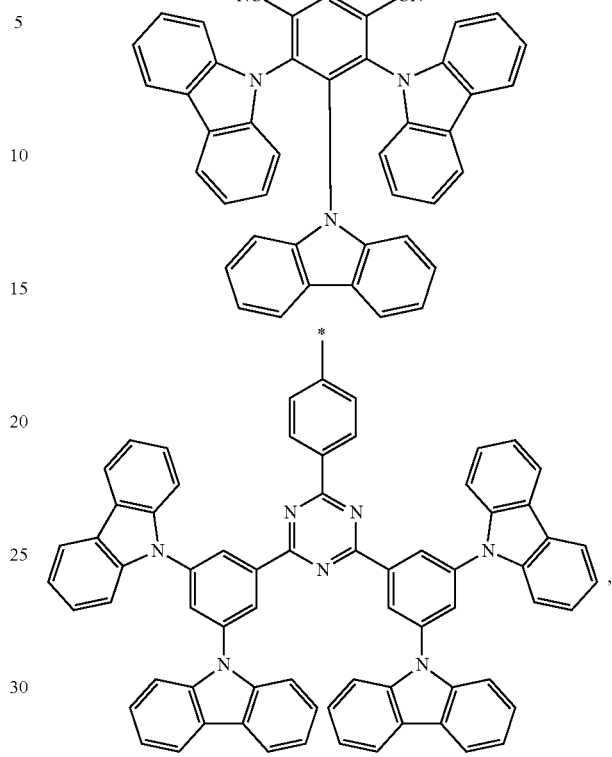

wherein R is a $C_1$-$C_{20}$ linear or branched alkyl group; the number of n is 1-6; and * is a connection position.

2. The block copolymer intrinsically stretchable electroluminescent elastomer of claim 1, wherein a+b+e+f=0.1-0.3.

3. The block copolymer intrinsically stretchable electroluminescent elastomer of claim 1, wherein the block copolymer intrinsically stretchable electroluminescent elastomer is selected from the group consisting of:

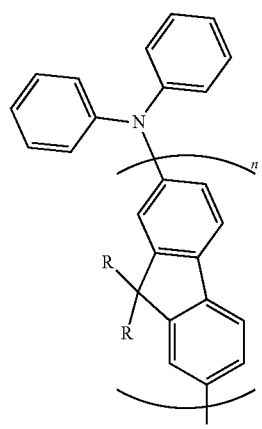

-continued
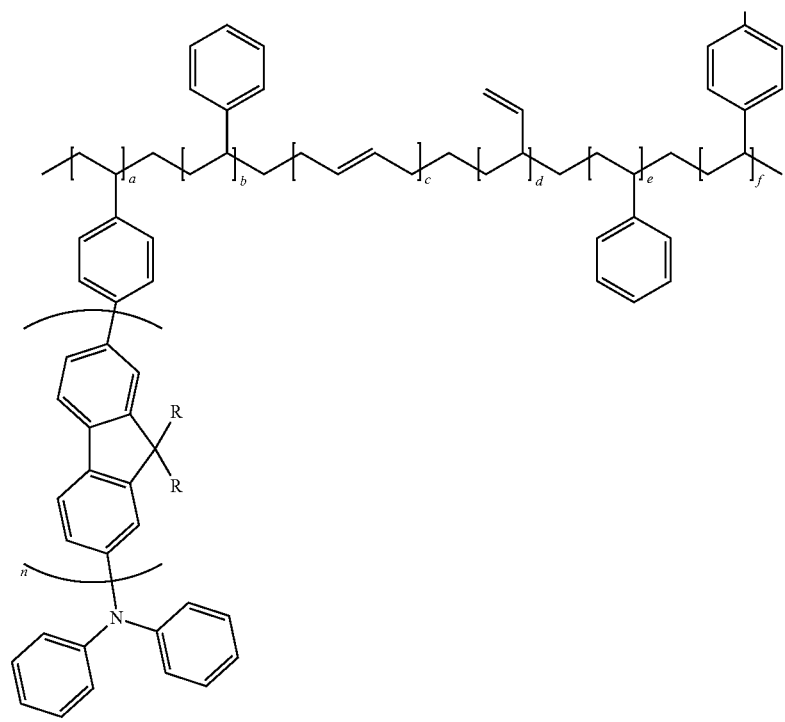
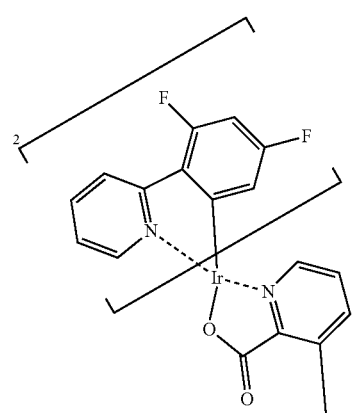

-continued
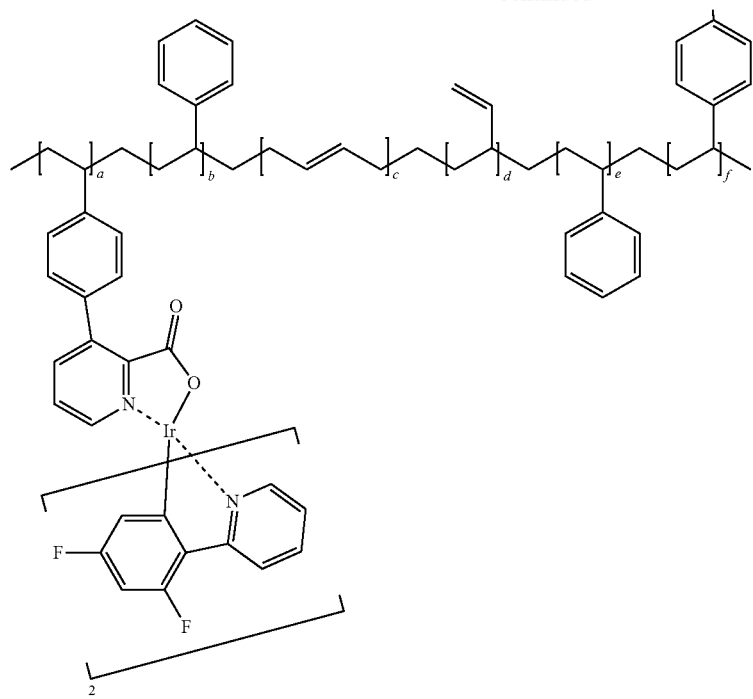
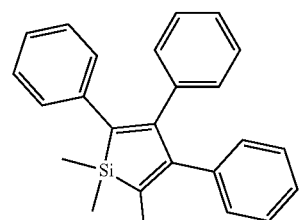
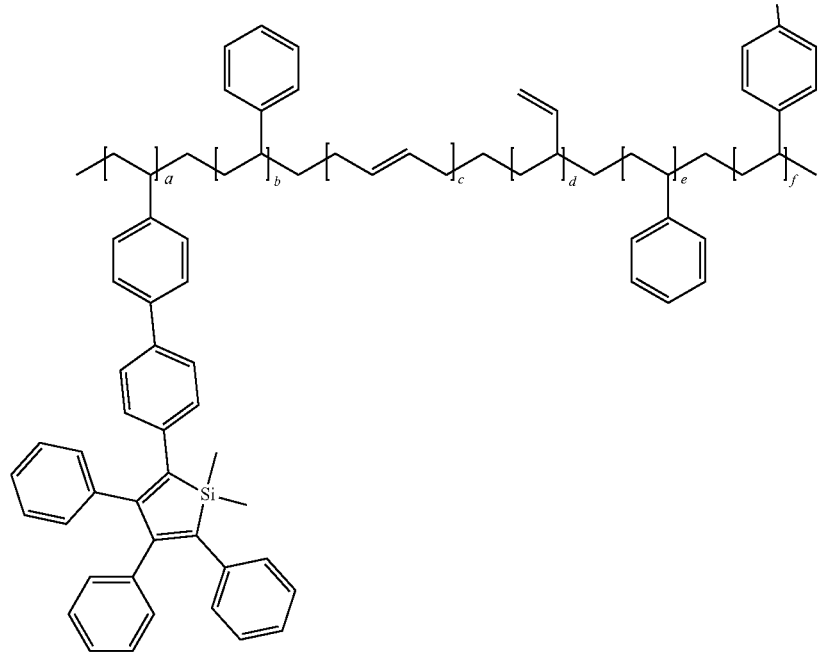

-continued

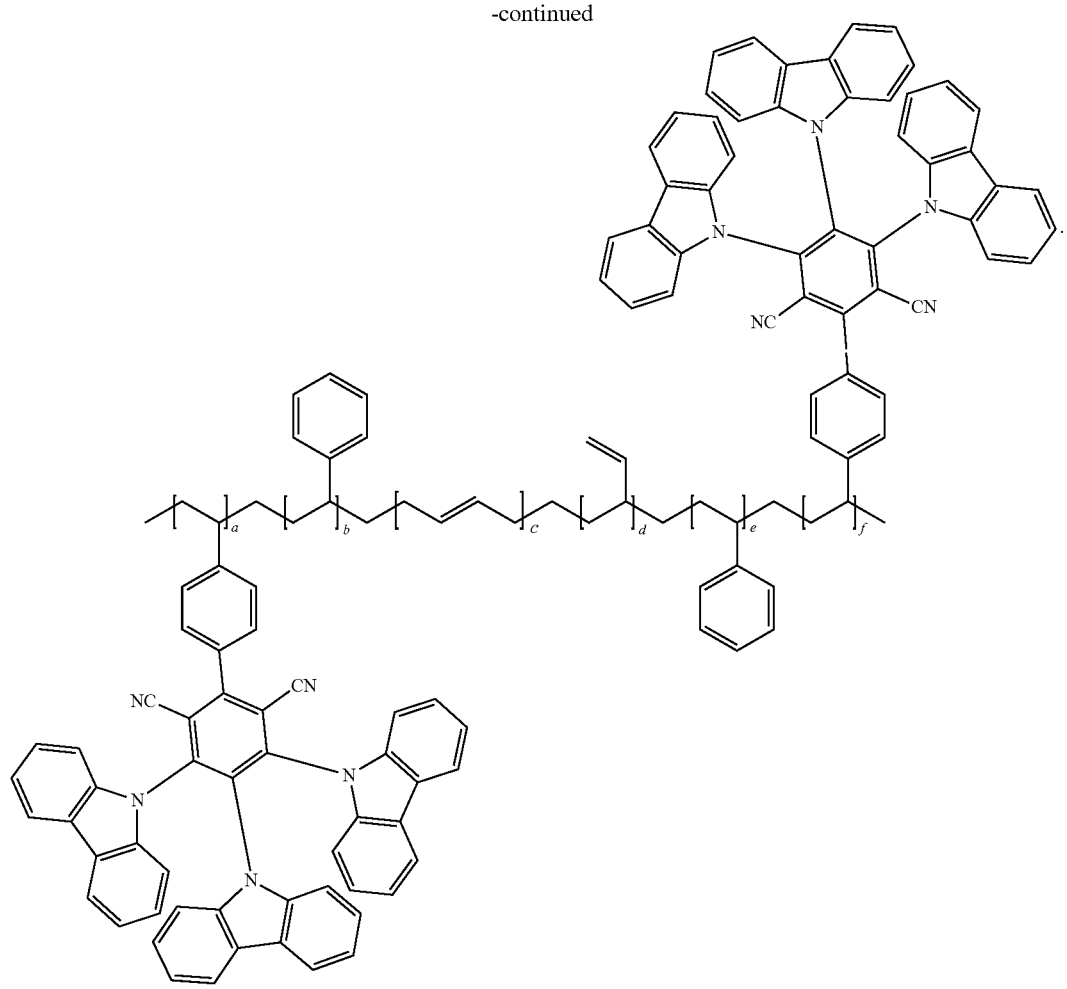

4. A method of preparing a block copolymer intrinsically stretchable electroluminescent elastomer of formula (1) of claim 1, the method comprising:

(S1) dissolving a

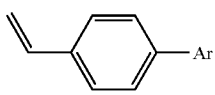

monomer and a styrene monomer in an organic solvent under protection of nitrogen; adding an additive and an initiator for reaction at 55-75° C. for 1-2 h to obtain a first reaction mixture;
wherein the organic solvent is selected from the group consisting of hexane, cyclohexane, toluene and dioxane;
the additive is selected from the group consisting of tetrahydrofuran, ether and acetonitrile; and
the initiator is n-butyl lithium;

(S2) adding a 1,3-butadiene monomer to the first reaction mixture for reaction at 50-70° C. for 2-3 h to obtain a second reaction mixture;

(S3) adding the

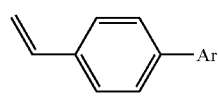

monomer and the styrene monomer to the third reaction mixture for reaction at 55-75° C. for 1-2 h to obtain a third reaction mixture; and (S4) quenching unreacted n-butyl lithium with absolute ethanol; cooling the third reaction mixture to room temperature; concentrating and dissolving the third reaction mixture with methylene chloride to produce a solution; and subjecting the solution precipitation with methanol and purification by column chromatography, followed by Soxhlet extraction for 24-72 hours, precipitation with methanol, suction filtration and drying to obtain the block copolymer intrinsically stretchable electroluminescent elastomer.

5. The method of claim 4, wherein a molar amount of the
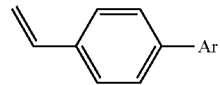
monomer is 1 mmol; an amount of the organic solvent is 5-25 mL; an amount of the additive is 0.02-0.08 mL; and an amount of the initiator is 0.02-0.08 mL.
* * * * *

UNITED STATES PATENT AND TRADEMARK OFFICE
CERTIFICATE OF CORRECTION

| | |
|---|---|
| PATENT NO. | : 12,012,481 B2 |
| APPLICATION NO. | : 17/133884 |
| DATED | : June 18, 2024 |
| INVENTOR(S) | : Wen-Yong Lai et al. |

It is certified that error appears in the above-identified patent and that said Letters Patent is hereby corrected as shown below:

On the Title Page

Item (30) Column 1, add under Item (21):
(30) Foreign Application Priority Data CN 202010551504 filed on JUN 17, 2020

Signed and Sealed this
Twentieth Day of August, 2024

Katherine Kelly Vidal
*Director of the United States Patent and Trademark Office*